(12) United States Patent
Sandhu

(10) Patent No.: US 7,579,278 B2
(45) Date of Patent: Aug. 25, 2009

(54) TOPOGRAPHY DIRECTED PATTERNING

(75) Inventor: Gurtej S. Sandhu, Boise, ID (US)

(73) Assignee: Micron Technology, Inc., Bosie, ID (US)

( * ) Notice: Subject to any disclaimer, the term of this patent is extended or adjusted under 35 U.S.C. 154(b) by 330 days.

(21) Appl. No.: 11/389,581

(22) Filed: Mar. 23, 2006

(65) Prior Publication Data

US 2007/0224823 A1 Sep. 27, 2007

(51) Int. Cl.
*H01L 21/302* (2006.01)

(52) U.S. Cl. .................. 438/689; 438/619; 438/620; 438/622; 438/637; 428/105; 428/220; 428/405; 430/270.1; 430/322

(58) Field of Classification Search ................. 438/689; 428/220; 430/270.1
See application file for complete search history.

(56) References Cited

U.S. PATENT DOCUMENTS

| | | | | |
|---|---|---|---|---|
| 5,328,810 | A * | 7/1994 | Lowrey et al. | 430/313 |
| 5,772,905 | A | 6/1998 | Chou | |
| 5,948,470 | A | 9/1999 | Harrison et al. | |
| 6,319,853 | B1 * | 11/2001 | Ishibashi et al. | 438/780 |
| 6,667,237 | B1 | 12/2003 | Metzler | |
| 6,911,400 | B2 * | 6/2005 | Colburn et al. | 438/758 |
| 6,926,953 | B2 * | 8/2005 | Nealey et al. | 428/220 |
| 7,115,525 | B2 | 10/2006 | Abatchev et al. | |
| 7,208,379 | B2 | 4/2007 | Venugopal et al. | |
| 2003/0170995 | A1 | 9/2003 | Chou | |
| 2004/0175628 | A1 * | 9/2004 | Nealey et al. | 430/1 |
| 2005/0112886 | A1 | 5/2005 | Asakawa et al. | |
| 2006/0046484 | A1 | 3/2006 | Abatchev et al. | |
| 2006/0216923 | A1 | 9/2006 | Tran et al. | |
| 2006/0281266 | A1 * | 12/2006 | Wells | 438/299 |
| 2007/0249170 | A1 | 10/2007 | Kewley | |
| 2007/0281219 | A1 | 12/2007 | Sandhu | |

FOREIGN PATENT DOCUMENTS

| | | |
|---|---|---|
| JP | 2003-155365 | 5/2003 |
| WO | WO 2006/101695 | 9/2006 |

(Continued)

OTHER PUBLICATIONS

Nealy et al, "Directed assembly of imaging layers for sub-30 nm lithography", *First International Nanotechnology Conference on Communication and Cooperation*, Jun. 2005, 2 pages.

(Continued)

*Primary Examiner*—Shamim Ahmed
*Assistant Examiner*—Maki Angadi
(74) *Attorney, Agent, or Firm*—Knobbe, Martens, Olson & Bear LLP

(57) ABSTRACT

A pattern having exceptionally small features is formed on a partially fabricated integrated circuit during integrated circuit fabrication. The pattern comprises features formed by self-organizing material, such as diblock copolymers. The organization of the copolymers is directed by spacers which have been formed by a pitch multiplication process in which spacers are formed at the sides of sacrificial mandrels, which are later removed to leave spaced-apart, free-standing spacers. Diblock copolymers, composed of two immiscible block species, are deposited over and in the space between the spacers. The copolymers are made to self-organize, with each block species aggregating with other block species of the same type.

25 Claims, 15 Drawing Sheets

FOREIGN PATENT DOCUMENTS

WO    WO 2007/027686    3/2007

OTHER PUBLICATIONS

Bates et al.; "Block Copolymers-Designer Soft Materials"; *Physics Today*; Feb. 1999, vol. 52, No. 2; pp. 32-38.

Callahan, Tim; "Pattern Formation"; Mathematics Department; www.math.lsa.umich.edu/~timcall/patterns/; Oct. 28, 2005; 5 pgs.

Cochran, Eric W.; Chemical Engineering-Iowa State University; www.iastate.edu/~ch_e/faculty/cochran.htm; Oct. 28, 2005; 2 pgs.

Fasolka et al.; "Block Copolymer Thin Films: Physics and Applications"; Annu. Rev. Mater. Res. 2001,31:323-355.

Guarini et al.; "Optimization of Diblock Copolymer Thin Film Self Assembly"; Adv. Mater. 2002, 14, No. 1, Sep. 16; pp. 1290-1294.

http://mrsec.uchicago.edu/Nuggets/Stripes/; Oct. 27, 2005; 3 pgs.

Herr, Daniel J.C.; "The Extensibility Of Optical Patterning Via Directed Self-Assembly Of Nano-Engineered Imaging Materials";Future Fab Intl.; www.future-fab.com; 8 pgs.; Oct. 27, 2005.

Jeong et al.; "Asymmetric Block Copolymers with Homopolymers: Routes to Multiple Length Scale Nanostructures"; Adv. Mater. 2002, 14, No. 4, Feb. 19; pp. 274-276.

Jeong et al.; "Volume Contractions Induced by Crosslinking: A Novel Route to Nanoporous Polymer Films"; Adv. Mater. 2003, 15, No. 15, Aug. 5: pp. 1247-1250.

Limary et al.; "Block Copolymer Thin Films Above and Below the Order-Disorder Transition Temperature"; Mat.Res.Soc.Symp. vol. 629; (2000) Materials Research Society;6pgs.

Tirrell et al.; "Self-Assembly in Materials Synthesis"; MRS Bulletin; vol. 30; Oct. 2005; pp. 700-704.

Zheng et al.; "Structural Evolution and Alignment of Cylinder-Forming PS-*b*-PEP Thin Films in Confinement Studied by Time-Lapse Atomic Force Microscopy"; Mater.Res.Soc.Symp.Proc. vol. 854E (2005) Materials Research Society; 4 pgs.

"Molecular Thermodynamics & Statistical Mechanics (MTSM) Research Group"; www.engr.wisc.edu/groups/mtsm/research.shtml; Oct. 28, 2005; 7 pgs.

"Polymer Research Laboratory"; www.princeton.edu/~polymer/block.html; Oct. 27, 2005; 2 pgs.

Black et al. "Nanometer-Scale Pattern Registration and Aignment by Directed Diblock Copolymer Self-Assembly," IEEE Transactions on Nanotechnology, vol. 3, No. 3 (Sep. 2004); pp. 412-415.

Black et al. "IBM demos new nanotechnology method to build chip components. Creates nanocrystal memory devices using self assembly technique compatible with conventional semiconductor processing," http://domino.research.ibm.com/comm/pr.nsf/pages/news.20031208_selfassembly.html; Dec. 8, 2003.

Carcia et al., "Thin films for Phase-shift Masks," *Vacuum and Thin Film*, IHS Publishing Group, 14-21 (Sep. 1999).

Cheng et al., "Fabrication of nanostructures with long-range order using block copolymer lithography," Applied Physics Letters, vol. 81, No. 19, pp. 3657-3659 (Nov. 4, 2002).

Edwards et al., "Precise Control over Molecular Dimensions of Block-Copolymer Domains Using the Interfacial Energy of Chemically Nanopatterned Substrates," *Advanced Materials*, 16, No. 15, (Aug. 4, 2004); pp. 1315-1319.

Guarini et al., "Low voltage, scalable nanocrystal Flash memory fabricated by templated self-assembly," Electron Devices Meeting 2003, IEDM 03 Technical Digest. *IEEE* International Dec. 8-10, (2003), pp. 22.2.1-22.2.4.

Kim et al., "Epitaxial self-assembly of block copolymers on lithographically defined nanopatterned substrates," *Nature* 424, 411-414 (Jul. 24, 2003).

Ngandu, K., "Resolution Enhancement Techniques for Optical Lithography," NNIN REU Research Accomplishments, 90-91 (2004).

Stoykovich et al., "Directed Assembly of Block Copolymer Blends into Nonregular Device-Oriented Structures," *Science*, vol. 308, 1442-1446 (Jun. 3, 2005).

Wang et al., "Symmetric diblock copolymer thin films confined between homogenous and patterned surfaces: Simulations and theory," *Journal of Chemical Physics* vol. 112, No. 22, (2000); pp. 9996-10010.

Park et al., "Enabling Nanotechnology with Self-Assembled Block Copolymer Patterns," *Polymer*, Elsevier Science Publishers, B.V., GB vol. 44, No. 22 pp. 6725-6760 (Oct. 2003).

Rockford et al., "Polymers on Nanoperiodic, Heterogeneous Surfaces," *Physical Review Letters APS USA*, vol. 82, No. 12 (Mar. 22, 1999).

International Search Report (International Application No. PCT/US2007/011524).

Chen et al., Achieving area-selective atomic layer deposition on patterned substrates by selective surface modification, Applied Physics Letters 86, 191910-1-191910-3 (2005).

Chou et al., Nanoimprint lithography, J.Vac. Sci. Technol. B 14(6), Nov./Dec. 1996, American Vacuum Society.

Park et al., Microcontact patterning of ruthenium gate electrodes by selective area atomic layer deposition, Applied Physics Letters 86, 051903 (2005).

Qin et al., On Wire Lithography, www.sciencemag.org, vol. 309, Jul. 1, 2005, p. 113-115.

Sinha et al., Area-Selective ALD of Titanium Dioxide Using Lithographically Defind Poly (methyl methacrylate) Films, Journal of the Electrochemical Society, 153 (5) G465-G469 (2006).

Sony CX-News vol. 29, 2002, Next Generation Low-Cost Electron Beam Lithography Fabrication Technology, www.sony.net/Products/SC-HP/cx_news/vol29/pdf/mask.pdf.

Choi et al., "Sublithographic nanofabrication technology for nanocatalysts and DNA chips," *J. Vac. Sci. Technol.*, pp. 2951-2955 (Nov./Dec. 2003).

PCT International Search Report of Sep. 26, 2008, International Application No. PCT/US2008/063943, Filed: May 16, 2008.

* cited by examiner

TOPOGRAPHY DIRECTED PATTERNING

BACKGROUND OF THE INVENTION

1. Field of the Invention

This invention relates generally to integrated circuit fabrication and, more particularly, to printing techniques.

2. Description of the Related Art

As a consequence of many factors, including demand for increased portability, computing power, memory capacity and energy efficiency, integrated circuits are continuously being made more dense. The sizes of the constituent features, e.g., electrical devices and interconnect lines, that form the integrated circuits are constantly being decreased to facilitate this scaling.

The trend of decreasing feature size is evident, for example, in memory circuits or devices such as dynamic random access memories (DRAMs), flash memory, static random access memories (SRAMs), ferroelectric (FE) memories, etc. To take one example, DRAM typically comprises millions of identical circuit elements, known as memory cells. In general, a capacitor-based memory cell, such as in conventional DRAM, typically includes two electrical devices: a storage capacitor and an access field effect transistor. Each memory cell is an addressable location that can store one bit (binary digit) of data. A bit can be written to a cell through the transistor and can be read by sensing charge in the capacitor. Some memory technologies employ elements that can act as both a storage device and a switch (e.g., dendritic memory employing silver-doped chalcogenide glass) and some nonvolatile memories do not require switches for each cell (e.g., magnetoresistive RAM) or incorporate switches into the memory element (e.g., EEPROM). By decreasing the sizes of the electrical devices that constitute a memory cell and the sizes of the conducting lines that access the memory cells, the memory devices can be made smaller. Additionally, storage capacities can be increased by fitting more memory cells on a given area in the memory devices. The need for reductions in feature sizes, however, is more generally applicable to integrated circuits, including general purpose and specialty processors.

The continual reduction in feature sizes places ever greater demands on the techniques used to form the features. For example, photolithography is commonly used to pattern these features. Typically, photolithography involves passing light through a reticle and focusing the light onto a photochemically-active photoresist material. Just as a slide has an image to be projected onto a screen, the reticle typically has a pattern to be transferred to a substrate. By directing light or radiation through the reticle, the pattern in the reticle can be focused on the photoresist. The light or radiation causes a chemical change in the illuminated parts of the photoresist, which allows those parts to be selectively retained, or removed, as desired, relative to parts which were in the shadows. Thus, the exposed and unexposed parts form a pattern in the photoresist. It will be appreciated that this pattern can be used as a mask to form various features of an integrated circuit, including conductive lines or parts of electrical devices.

Because lithography is typically accomplished by projecting light or radiation onto a surface, the ultimate resolution of a particular lithography technique depends upon factors such as optics and light or radiation wavelength. For example, the ability to focus well-defined patterns onto resist depends upon the size of the features and on the wavelength of the radiation projected through the reticle. It will be appreciated that resolution decreases with increasing wavelength, due, among other things, to diffraction. Thus, shorter wavelength radiation is typically required to form well-resolved features, as the sizes of the features decrease. Consequently, to facilitate reductions in feature sizes, lower and lower wavelength systems have been proposed.

For example, 365 nm, 248 nm, 193 nm and 157 nm wavelength systems have been developed as features sizes have decreased. Additional reductions in feature sizes, e.g., down to 20 nm features, may require even shorter wavelength systems. For example, X-ray based lithography, using X-ray radiation instead of light, has been proposed to form very small features, such as 20 nm features. Another proposed technology is extreme ultraviolet (EUV) lithography, using, e.g., 13.7 nm radiation. X-ray and EUV lithography, however, are expected to be prohibitively expensive to implement. In addition to cost, the techniques face various technical obstacles. For example, for X-ray lithography, these obstacles include difficulties in forming high quality reticles which are sufficiently opaque to X-rays and difficulties in devising resists which are sufficiently sensitive to the X-rays. Moreover, rather than using optics to focus radiation on the resist, some X-ray systems place the reticle close to the resist, to directly expose the resist to X-rays passing through the reticle. This can cause complications in aligning the reticle with the resist and, in addition, places significant demands on the flatness of both the reticle and the resist. In addition, X-ray lithography can use reflective as opposed to refractive optics, which can require a complete redesign of optical elements and related systems. Similarly, other high resolution lithography techniques, including ion beam and electron beam lithography, have their own technical and practical obstacles, including high complexity and costs.

Accordingly, there is a continuing need for high resolution methods to pattern small features on semiconductor substrates.

SUMMARY OF THE INVENTION

According to one aspect of the invention, a method is provided for forming a pattern over a semiconductor substrate. The method comprises providing a plurality of pitch multiplied features overlying the semiconductor substrate. A self-organizing material is provided between the pitch multiplied features. Segregation of chemical moieties forming the self-organizing material is initiated.

According to another aspect of the invention, a method is provided for forming a mask pattern. The method comprises forming a plurality of spacers by pitch multiplication. A film is deposited between the spacers. The film is annealed to form a repeating pattern of features within the film.

According to yet another aspect of the invention, a method is provided for semiconductor fabrication. The method comprises providing a plurality of lines having a pitch of about 200 nm or less. A pattern comprising block copolymers is formed between the plurality of lines.

According to another aspect of the invention, a method is provided for mask formation. The method comprises providing a pattern of spacers over a semiconductor substrate. The method also comprises providing a homogeneous mask material extending between the spacers. The mask material is exposed to an etchant to form a pattern of voids in the exposed mask material.

According to yet another aspect of the invention, a method of semiconductor processing is provided. The method comprises forming a first set of block domains over a semiconductor substrate. The first set of block copolymers includes a plurality of separated groups of block domains. The block domains are formed substantially by like blocks of a block copolymer. A second set of block domains is subsequently formed in spaces between the separated groups of block domains.

According to another aspect of the invention, a partially fabricated integrated circuit is provided. The partially fabricated integrated circuit comprises a plurality of copolymer guides overlying a semiconductor substrate, the guides having a pitch of about 200 nm or less. The partially fabricated integrated circuit also comprises block copolymers disposed between the plurality of copolymer guides.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION OF THE PREFERRED EMBODIMENTS

Figure 1:
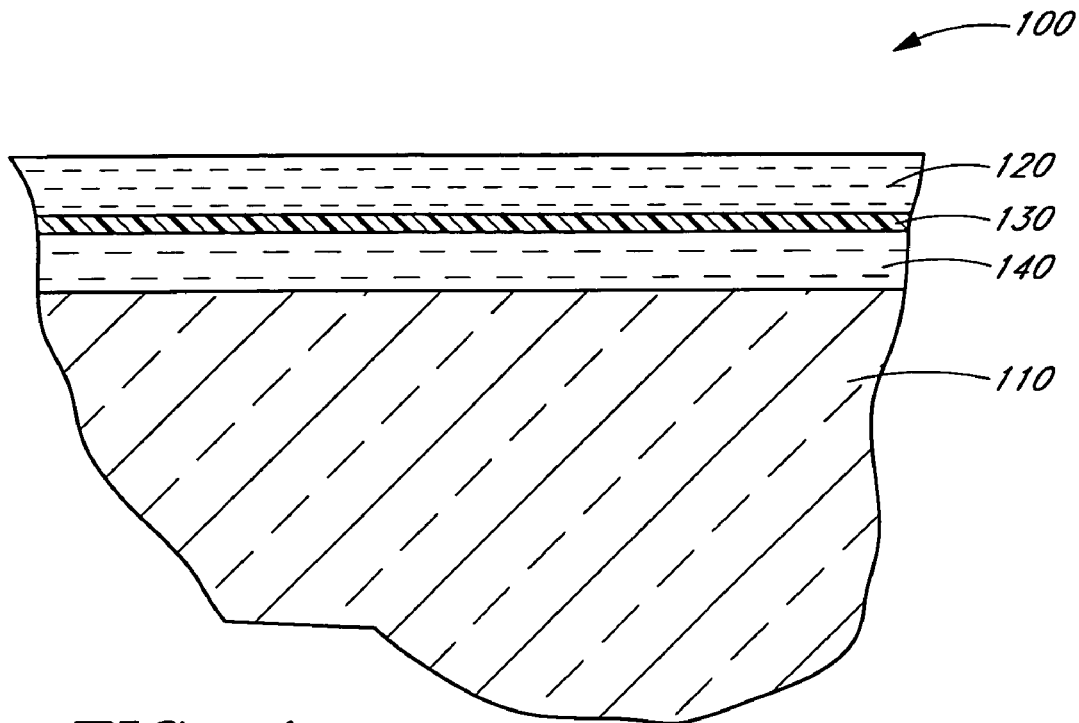
FIG. 1 is a schematic cross-sectional side view of a partially formed integrated circuit, in accordance with preferred embodiments of the invention.

The ability of block copolymers to self-organize can be used to form mask patterns. Block copolymers are formed of two or more chemically distinct blocks. For example, each block can be formed of a different monomer. The blocks are preferably immiscible or thermodynamically incompatible, e.g., one block can be polar and the other can be non-polar. Due to thermodynamic effects, the copolymers will self-organize in solution to minimize the energy of the system as a whole; typically, this causes copolymers to move relative to one another, e.g., so that like blocks aggregate together, thereby forming alternating regions containing each block type or species. For example, if the copolymers are formed of polar and non-polar blocks, the blocks will segregate so that non-polar blocks aggregate with other non-polar blocks and polar blocks aggregate with other polar blocks. It will be appreciated that the block copolymers may be described as a self-organizing material since the blocks can move to form a pattern without application of an external force to direct the movement of individual molecules, although heat may be applied to increase the rate of movement as noted below.

In addition to interactions between the block species, the self-organization of block copolymers can be influenced by topographical features, such as steps on the surface on which the block copolymers are deposited. For example, a diblock copolymer, a copolymer formed of two different block species, can form alternating regions which are each formed of a substantially different block species. When the self-organization occurs in the area between the walls of a step, the steps can interact with the blocks such that each of the alternating regions formed by the blocks can be made to extend parallel to the walls.

Such self-organization can be useful in forming masks for patterning features during semiconductor fabrication processes. For example, one of the alternating regions can be removed, thereby leaving the other regions to function as a mask. The mask can be used to pattern features such as electrical devices in an underlying semiconductor substrate.

It will be appreciated that the size of the alternating regions is related to the size of the block copolymers and can be on the order of nanometers or tens of nanometers. Various lithography methods, such as X-ray, EUV, ion beam and electron beam lithography are possible candidates for forming the closely-spaced step features. However, application of these methods, as noted above, has various technical and practical obstacles which can make their use impractical and prohibitively expensive.

In preferred embodiments of the invention, rather than defining the steps in a single lithography step, relatively large features are first defined and smaller step features are then derived from the relatively large features. Block copolymers are then applied around the steps and allowed to self-organize in the space between the step, or guide, features. Some of the blocks are subsequently selectively removed. The remaining block species can be used as a mask for subsequent patterning of underlining materials during, e.g., the fabrication of integrated circuits.

Preferably, pitch multiplication is used to form the small step features. For example, a relatively large feature can be patterned by conventional photolithography to form a pattern of temporary placeholders, or mandrels. Spacers are formed on the sides of the mandrels and the mandrels are then removed, leaving a pattern of free-standing spacers which can function as guides for directing the self-organization of block copolymers.

Pitch multiplication advantageously allows the formation of small, closely-spaced step features which might otherwise be formed using newer, relatively complex and expensive lithography techniques. Advantageously, conventional, proven and relatively inexpensive lithography techniques can be utilized, thereby reducing costs and increasing process reliability. Moreover, the self-organizing behavior of block copolymers allows the reliable formation of very small features, thereby facilitating the formation of a mask with a very small feature size. For example, features having a critical dimension of about 50 nm or less, more preferably, about 30 nm or less and, more preferably about 20 nm or less can be formed.

Reference will now be made to the Figures, wherein like numerals refer to like parts throughout. It will be appreciated that the Figures are not necessarily drawn to scale.

In a first phase of methods according to the preferred embodiments, a plurality of spacers is formed over a substrate by pitch multiplication. Suitable pitch multiplication techniques are described in U.S. Pat. No. 5,328,810, issued to Lowrey et al., and U.S. patent application Ser. No. 11/214,544, by Tran et al., filed Aug. 29, 2005. The entire disclosures of these references are incorporated by reference herein. It will be appreciated that the preferred embodiments can be applied to form masks used in the fabrication of various integrated circuits. These integrated circuits can include, e.g., memory chips or computer processors.

With reference to FIG. 1, a cross-sectional side view of a partially formed integrated circuit 100 is illustrated. Various layers 120-140 are preferably provided above a substrate 110 to facilitate pitch multiplication. The materials for the layers 120-140 overlying the substrate 110 are preferably chosen based upon consideration of the interaction of the layers with block copolymer materials to be used and of the chemistry and process conditions for the various pattern forming and pattern transferring steps discussed herein. Because patterns in upper layers are preferably transferred to lower layers during pitch multiplication, lower masking layers 130, 140 between a selectively definable layer 120 and the substrate 110 are preferably chosen so that they can be selectively etched relative to other exposed materials. It will be appreciated that a material is considered selectively, or preferentially, etched when the etch rate for that material is at least about 2-3 times greater, preferably at least about 10 times greater, more preferably at least about 20 times greater and, most preferably, at least about 40 times greater than that for surrounding materials. Because an objective for the layers 120-140 is to allow well-defined patterns to be formed above the substrate 110, it will be appreciated that one or more of the layers 120-140 can be omitted or substituted, or additional layers can be added, if suitable other materials, chemistries and/or process conditions are used.

It will be appreciated that the "substrate" to which patterns are transferred can include a layer of a single material, a plurality of layers of different materials, a layer or layers having regions of different materials or structures in them, etc. These materials can include semiconductors, insulators, conductors, or combinations thereof. For example, the substrate can comprise doped polysilicon, an electrical device active area, a silicide, or a metal layer, such as a tungsten, aluminum or copper layer, or combinations thereof. In some embodiments, the mask features discussed below can directly correspond to the desired placement of conductive features, such as interconnects, in the substrate. In other embodiments, the substrate can be an insulator and the location of mask features can correspond to the desired location of insulation between conductive features, such as in damascene metallization.

With continued reference to FIG. 1, the selectively definable layer 120 overlies a hard mask, or etch stop, layer 130, which overlies a temporary layer 140, which overlies the substrate 110. The selectively definable layer 120 is preferably photodefinable, e.g., formed of a photoresist, including any photoresist known in the art. For example, the photoresist can be any photoresist compatible with 157 nm, 193 nm, 248 nm or 365 nm wavelength systems, 193 nm wavelength immersion systems. Examples of preferred photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are preferably used with photolithography systems utilizing relatively short wavelength light, e.g., 193 nm. KrF photoresists are preferably used with longer wavelength photolithography systems, such as 248 nm systems. In addition, while pitch multiplication can obviate the need to define extremely small features with expensive, relatively new direct formation techniques such as extreme ultraviolet systems (including 13.7 nm wavelength systems) or electron beam lithographic systems, such systems can also be used, if desired. In addition, maskless lithography, or maskless photolithography, can be used to define the selectively definable layer 120. In other embodiments, the layer 120 and any subsequent resist layers can be formed of a resist that can be patterned by nanoimprint lithography, e.g., by using a mold or mechanical force to form a pattern in the resist.

The material for the hard mask layer 130 preferably comprises an inorganic material. Exemplary materials include silicon oxide ($SiO_2$), silicon or a dielectric anti-reflective coating (DARC), such as a silicon-rich silicon oxynitride. Preferably, the hard mask layer 130 is a dielectric anti-reflective coating (DARC). Using DARCs for the hard mask layer 130 can be particularly advantageous for forming patterns having pitches near the resolution limits of a photolithographic technique. The DARCs can enhance resolution by minimizing light reflections, thus increasing the precision with which photolithography can define the edges of a pattern.

The temporary layer 140 is preferably formed of amorphous carbon, which offers very high etch selectivity relative to the preferred hard mask materials. More preferably, the amorphous carbon is a form of amorphous carbon that is highly transparent to light and that offers further improvements for photo alignment by being transparent to the wavelengths of light used for such alignment. Techniques for forming such transparent carbon can be found in A. Helmbold, D. Meissner, Thin Solid Films, 283 (1996) 196-203. The entire disclosure of this reference is incorporated herein by reference.

Figure 2:
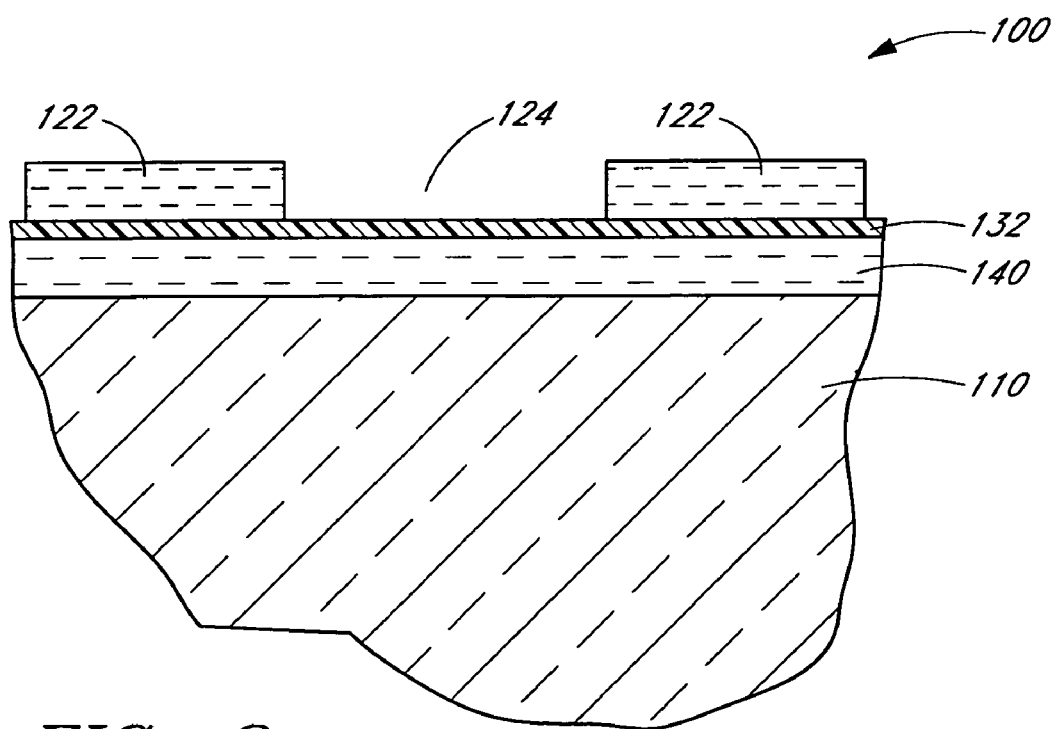
FIG. 2 is a schematic cross-sectional side view of the partially formed integrated circuit of FIG. 1 after forming features in a photoresist layer, in accordance with preferred embodiments of the invention.

With reference to FIG. 2, the photodefinable layer 120 is exposed to radiation through a reticle and then developed to leave a pattern comprising features 122 which are formed of photodefinable material. It will be appreciated that the pitch of the resulting features 122, e.g., lines, is equal to the sum of the width of a line 122 and the width of a neighboring space 124. If desired, the dimensions of the line 122 can be adjusted by using, e.g., an isotropic etch to decrease both the height and the width of the line 122. The pitch of the features 122 can be, e.g., about 200 nm or about 120 nm.

Figure 3:
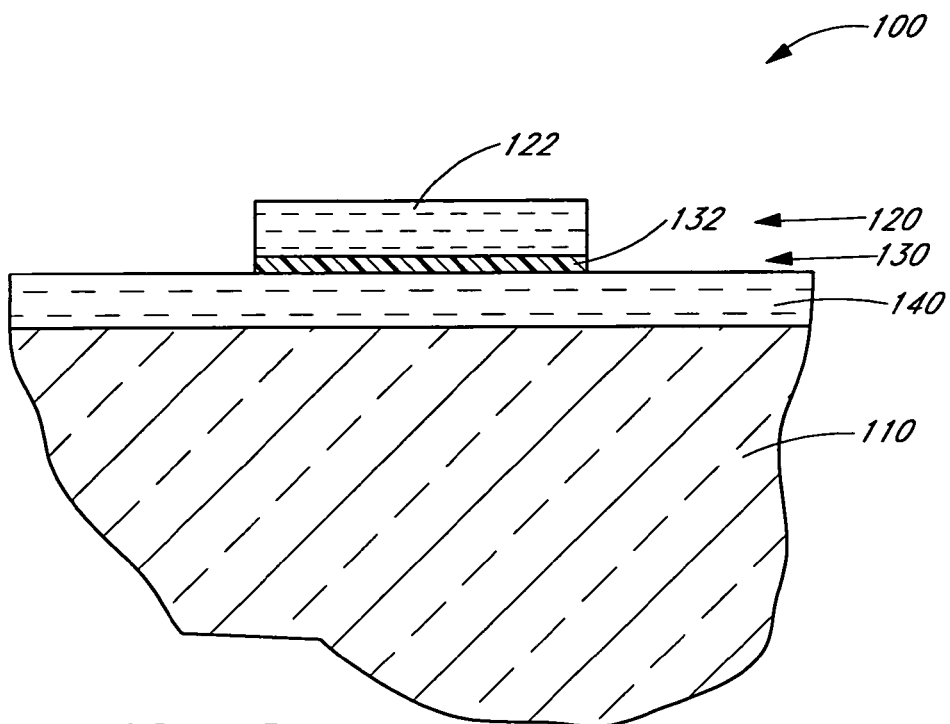
FIG. 3 is a schematic cross-sectional side view of the partially formed integrated circuit of FIG. 2 after etching through a hard mask layer, in accordance with preferred embodiments of the invention.

With reference to FIG. 3, the pattern in the photodefinable layer 120 is transferred to the hard mask layer 130 thereby forming features 132 in the hard mask layer 130. In particular, FIG. 3 shows the features 122 and 132 in isolation. The pattern transfer is preferably accomplished using an anisotropic etch, such as an etch using a fluorocarbon plasma, although a wet (isotropic) etch may also be suitable if the hard mask layer 130 is sufficiently thin. Preferred fluorocarbon plasma etch chemistries include $CFH_3$, $CF_2H_2$, $CF_3H$ and $CF_4/HBr$. Resist forming the photodefinable layer 120 can optionally be removed, e.g., by plasma ashing. In the illustrated embodiment, the resist removal can be delayed and advantageously is efficiently performed in a single step with etching of the temporary layer 140.

Figure 4:
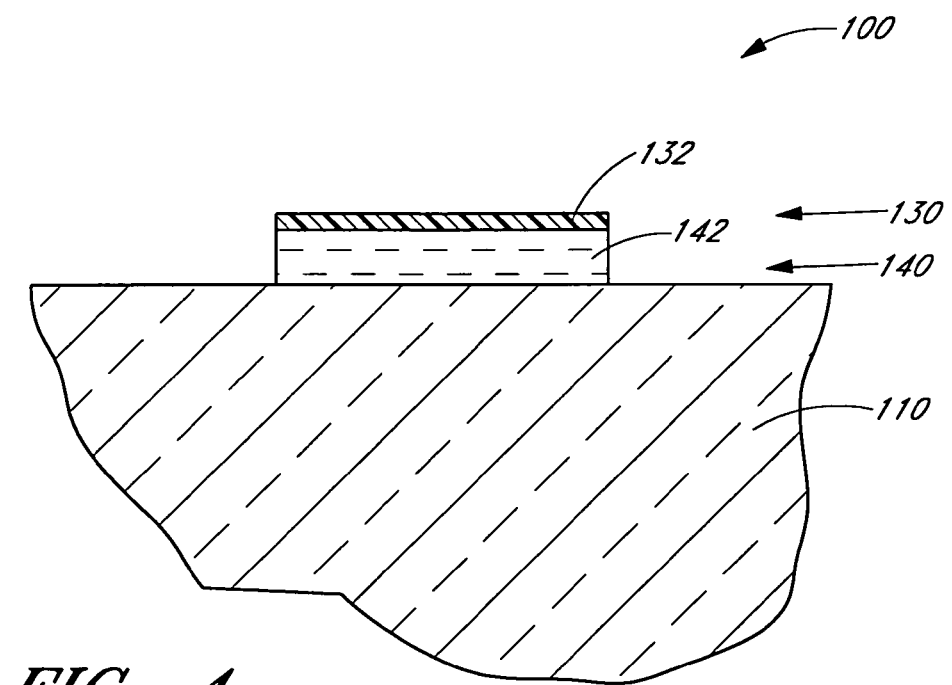
FIG. 4 is a schematic, cross-sectional side view of the partially formed integrated circuit of FIG. 3 after removing the photoresistphotoresist and transferring a pattern from the hard mask layer to a temporary layer, in accordance with preferred embodiments of the invention.
Figure 6:
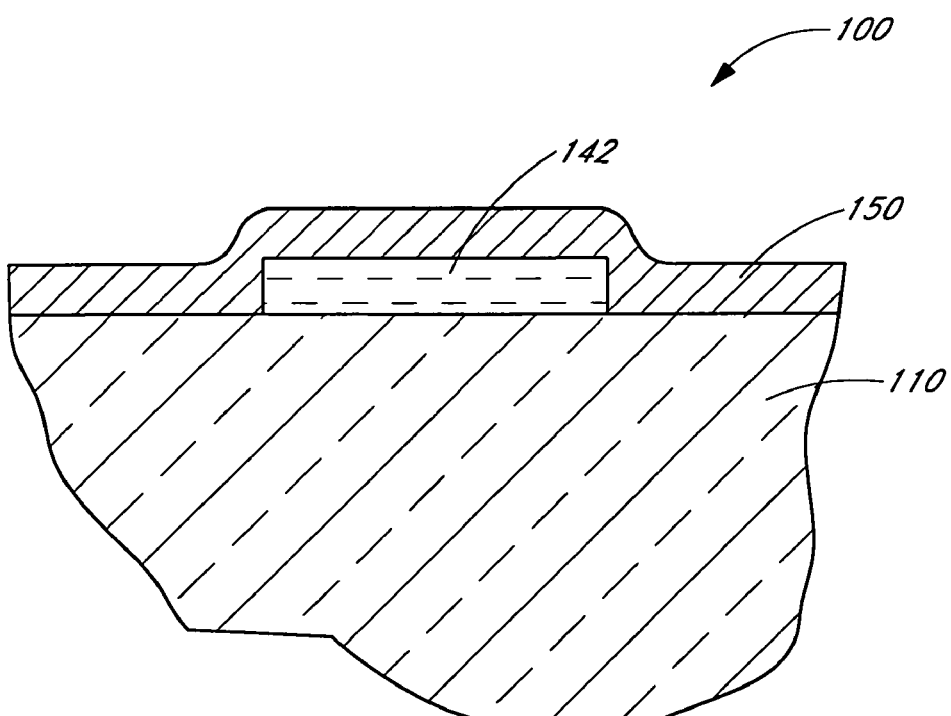
FIG. 6 is a schematic, cross-sectional side view of the partially formed integrated circuit of FIG. 5 after depositing a layer of a spacer material, in accordance with preferred embodiments of the invention.

With reference to FIG. 4, the pattern in the photodefinable layer 120 and the hard mask layer 130 is transferred to the temporary layer 140 to allow for deposition of a layer 150 of spacer material (FIG. 6). It has been found that the temperatures used for spacer material deposition are typically too high for photoresist to withstand. Thus, the pattern is preferably transferred from the features 122 in the photodefinable layer 120 (FIG. 3) to the temporary layer 140, which is formed of a material that can withstand the process conditions for spacer material deposition and etch, discussed below. In addition to having higher heat resistance than photoresist, the material forming the temporary layer 140 is preferably selected such that it can be selectively removed relative to the material for the spacers 152 (FIG. 7) to be formed and any underlying material, e.g., the substrate 110. As noted above, the layer 140 is preferably formed of amorphous carbon and, more preferably, transparent carbon.

The pattern of features 122 in the modified photodefinable layer 120 is preferably transferred to the temporary layer 140 using an $O_2$-containing plasma, e.g., a plasma containing $SO_2$, $O_2$ and Ar. Other suitable etch chemistries include a $Cl_2/O_2/SiCl_4$ or $SiCl_4/O_2/N_2$ or $HBr/O_2/N_2/SiCl_4$ containing plasma. Advantageously, the $SO_2$-containing plasma is used as it can etch carbon of the preferred temporary layer 140 at a rate greater than 20 times and, more preferably, greater than 40 times the rate that the hard mask layer 130 is etched. A suitable $SO_2$-containing plasma is described in U.S. patent application Ser. No. 10/931,772 to Abatchev et al., filed Aug. 31, 2004, the entire disclosure of which is incorporate herein by reference. It will be appreciated that the $SO_2$-containing plasma can simultaneously etch the temporary layer 140 and also remove the features 122 formed from the photodefinable layer 120. The resulting lines 142 in the temporary layer 140 constitute the placeholders or mandrels along which a pattern of spacers 152 (FIG. 7) will be formed.

Figure 5:
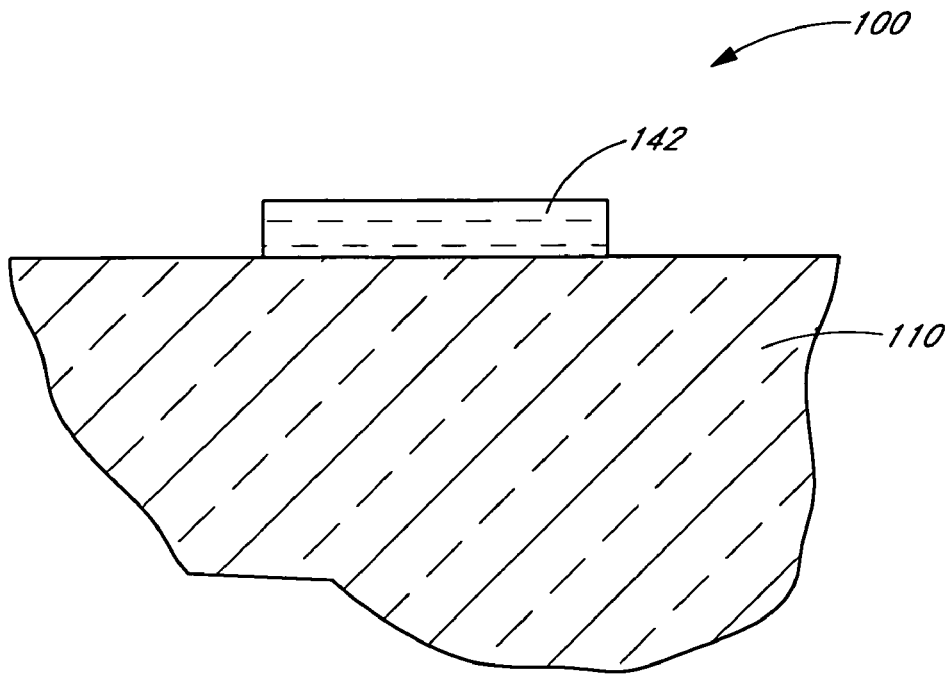
FIG. 5 is a schematic, cross-sectional side view of the partially formed integrated circuit of FIG. 4 after a hard mask layer removal, in accordance with preferred embodiments of the invention.
Figure 8:
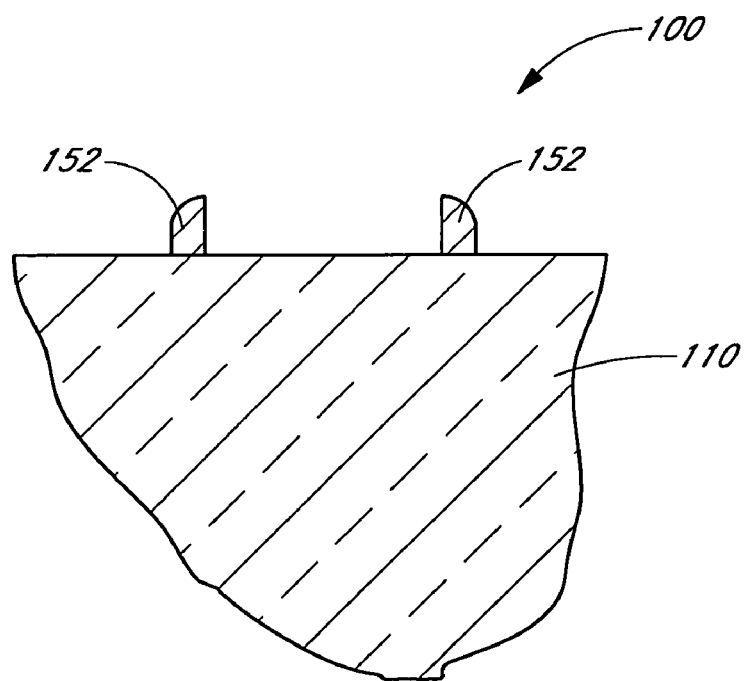
FIG. 8 is a schematic, cross-sectional side view of the partially formed integrated circuit of FIG. 7 after removing a remaining portion of the temporary layer to leave a pattern of spacers, in accordance with preferred embodiments of the invention.

With reference to FIG. 5, the material 132 from the hard mask layer 130 (FIG. 4) can be removed to facilitate later spacer formation by leaving the temporary layer 140 exposed for subsequent etching (FIG. 8). The preferred hard mask layer 130 can be removed using a buffered oxide etch (BOE), which is a wet etch comprising HF and $NH_4F$.

Next, as shown in FIG. 6, a layer 150 of spacer material is preferably blanket deposited conformally over exposed surfaces, including the hard mask layer 130 (if remaining) and the top and sidewalls of the mandrels 142. The spacer material can be any material that can act as a mask for transferring a pattern to the underlying substrate 110 and allows for etch selectivity relative to one or more block species of a block copolymer, as discussed below. The spacer material preferably: 1) can be deposited with good step coverage; and 2) can be deposited at a temperature compatible with the temporary layer 140. Preferred materials include silicon, silicon oxides and silicon nitrides. In the illustrated embodiment, the spacer material is silicon oxide, which provides particular advantages in combination with other selected materials of the masking stack.

Preferred methods for spacer material deposition include chemical vapor deposition, e.g., using $O_3$ and TEOS to form silicon oxide, and atomic layer deposition, e.g., using a silicon precursor with an oxygen or nitrogen precursor to form silicon oxides or nitrides, respectively. The thickness of the layer 150 is preferably determined based upon the desired width of the spacers 152 (FIG. 8). Preferably, the step coverage is about 80% or greater and, more preferably, about 90% or greater. Advantageously, atomic layer deposition allows for a high degree of control over the thickness of the deposited layer 150. This control can be especially beneficial when forming guides for block copolymers, since the self-organization of the block copolymers is influenced by the thickness of the deposited block copolymer material and since the height of the spacers 152 is preferably sufficiently close to the thickness of the block copolymer material (to be deposited) to allow some block copolymer material to overlie the spacers 152 while still being continuous with copolymer material between the spacers 152. Advantageously, as noted below, having copolymer material overlying the spacers 152 can provide a reservoir of copolymer material which can guard against the depletion of copolymers during copolymer self-organization.

Figure 7:
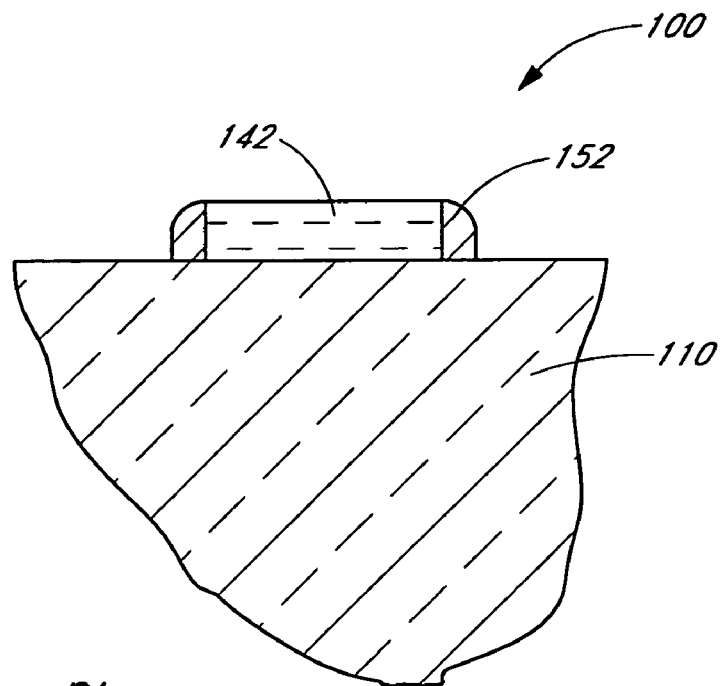
FIG. 7 is a schematic, cross-sectional side view of the partially formed integrated circuit of FIG. 6 after a spacer etch, in accordance with preferred embodiments of the invention.

With reference to FIG. 7, the silicon oxide spacer layer 150 is then subjected to an anisotropic etch to remove spacer material from horizontal surfaces 154 of the partially formed integrated circuit 100. Such an etch, also known as a spacer etch, can be performed using a fluorocarbon plasma, e.g., containing $CF_4/CHF_3$, $C_4F_8/CH_2F_2$ or $CHF_3/Ar$ plasma.

With reference to FIG. 8, the mandrels or temporary placeholders 142 (FIG. 7) are next removed to leave freestanding spacers 152. The mandrels 142 are selectively removed using an organic strip process. Preferred etch chemistries include a oxygen-containing plasma etch, such as an etch using $SO_2$.

As noted above, the height of the spacers 152 can influence the organization of block copolymers, as noted below. As a result, the spacers 152 can optionally be trimmed, e.g., using an anisotropic etch. In other embodiments, the height of the mandrels 142 (FIG. 6) and/or the thickness of the temporary layer 140 (FIG. 1) can be selected so as to form spacers 152 of the desired height.

With continued reference to FIG. 8, pitch multiplication has thus been accomplished. In the illustrated embodiment, the pitch of the spacers 152 is roughly half that of the photoresist lines 122 and spaces 124 (FIG. 2) originally formed by photolithography. For example, where the photoresist lines 122 had a pitch of about 400 nm, spacers 152 having a pitch of about 200 nm or less can be formed. In some embodiments where the photoresist lines 122 had a pitch of about 200 nm, spacers 152 having a pitch of about 100 nm or less can be formed.

Block copolymers are next applied and block copolymer self-organization is facilitated to form a mask pattern over the substrate 110. A suitable method for forming self-organized block copolymer patterns is disclosed in Block, IEE Transactions in Nanotechnology, Vol. 3, No. 3, September 2004. The entire disclosure of that reference is incorporated by reference herein.

Figure 9:
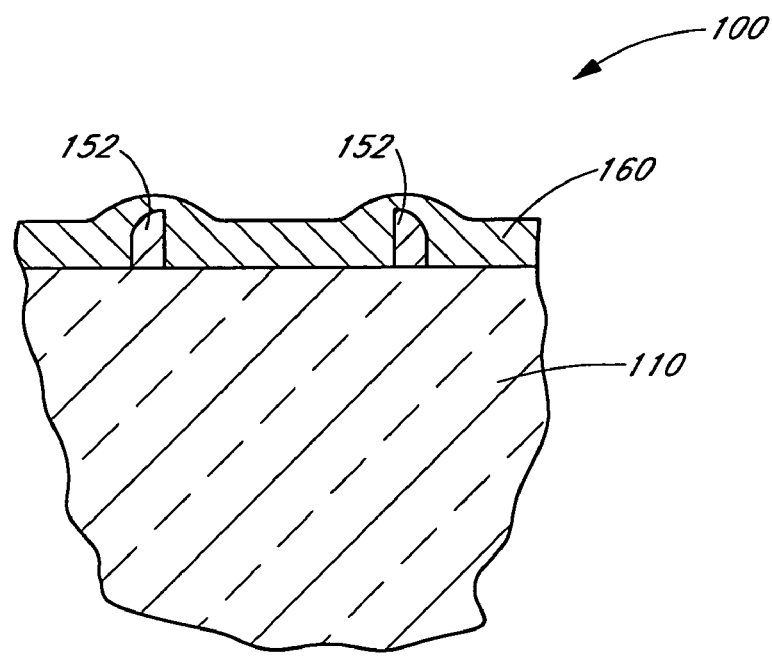
FIG. 9 is a schematic, cross-sectional side view of the partially formed integrated circuit of FIG. 8 after depositing a layer of a block copolymer solution, in accordance with preferred embodiments of the invention.

With reference to FIG. 9, a film 160 of block copolymer material is deposited between and over the spacers 152. The copolymer comprises blocks of polymer material which can be selectively etched relative to one another and can self-organize in a desired and predictable manner, e.g., the blocks are preferably immiscible and will segregate under appropriate conditions to form domains predominantly containing a single block species. In the exemplary illustrated embodiment, the copolymer is a diblock copolymer, comprising, e.g., polystyrene (PS) and poly-methylmethacrylate (PMMA) in a 70:30 PS:PMMA ratio with a total molecular weight of 64 kg/mol. The diblock copolymer can be provided dissolved in a solvent, e.g., toluene. Preferably, the copolymers are substantially all the same size and composition, to increase the predictability and regularity of the patterns formed by the self-organization of the copolymers. It will be appreciated that the total size of each diblock copolymer and the ratio of the constituent blocks and monomers are preferably chosen to facilitate self-organization and to form organized block domains having desired dimensions. The block copolymers have an intrinsic polymer length scale, the average end-to-end length of the copolymer in film, including any coiling or kinking, which governs the size of the block domains. Longer copolymers may be used to form larger domains and shorter copolymers may be used to form smaller domains. The block copolymer can be deposited by various methods, including, e.g., spin-on coating, spin casting, brush coating or vapor deposition.

Figure 11:
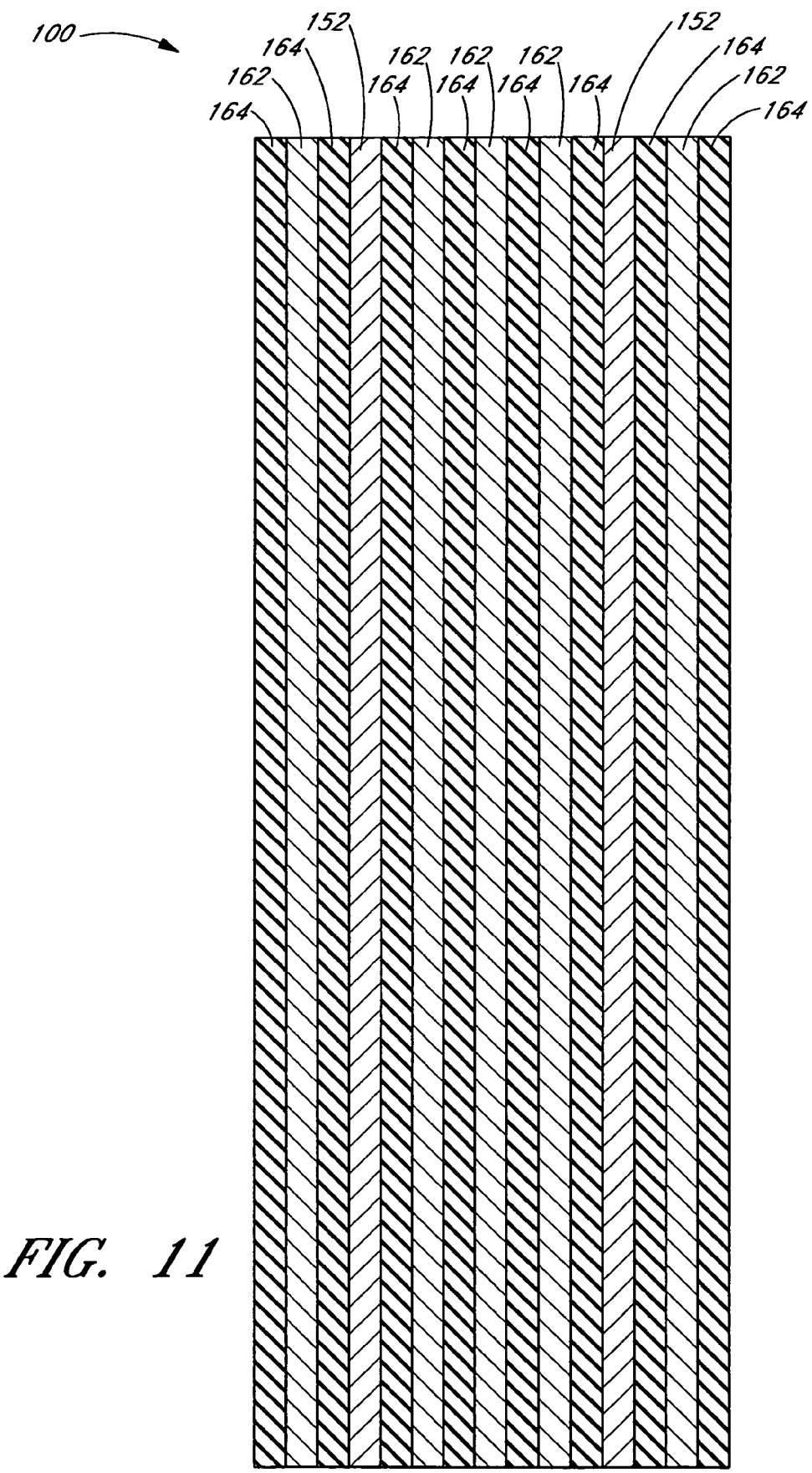
FIGS. 11 and 12 are schematic, cross-sectional top views of the partially formed integrated circuit of FIG. 10 showing two exemplary copolymer arrangements resulting from the self-organization of the block copolymers, in accordance with preferred embodiments of the invention.
Figure 12:
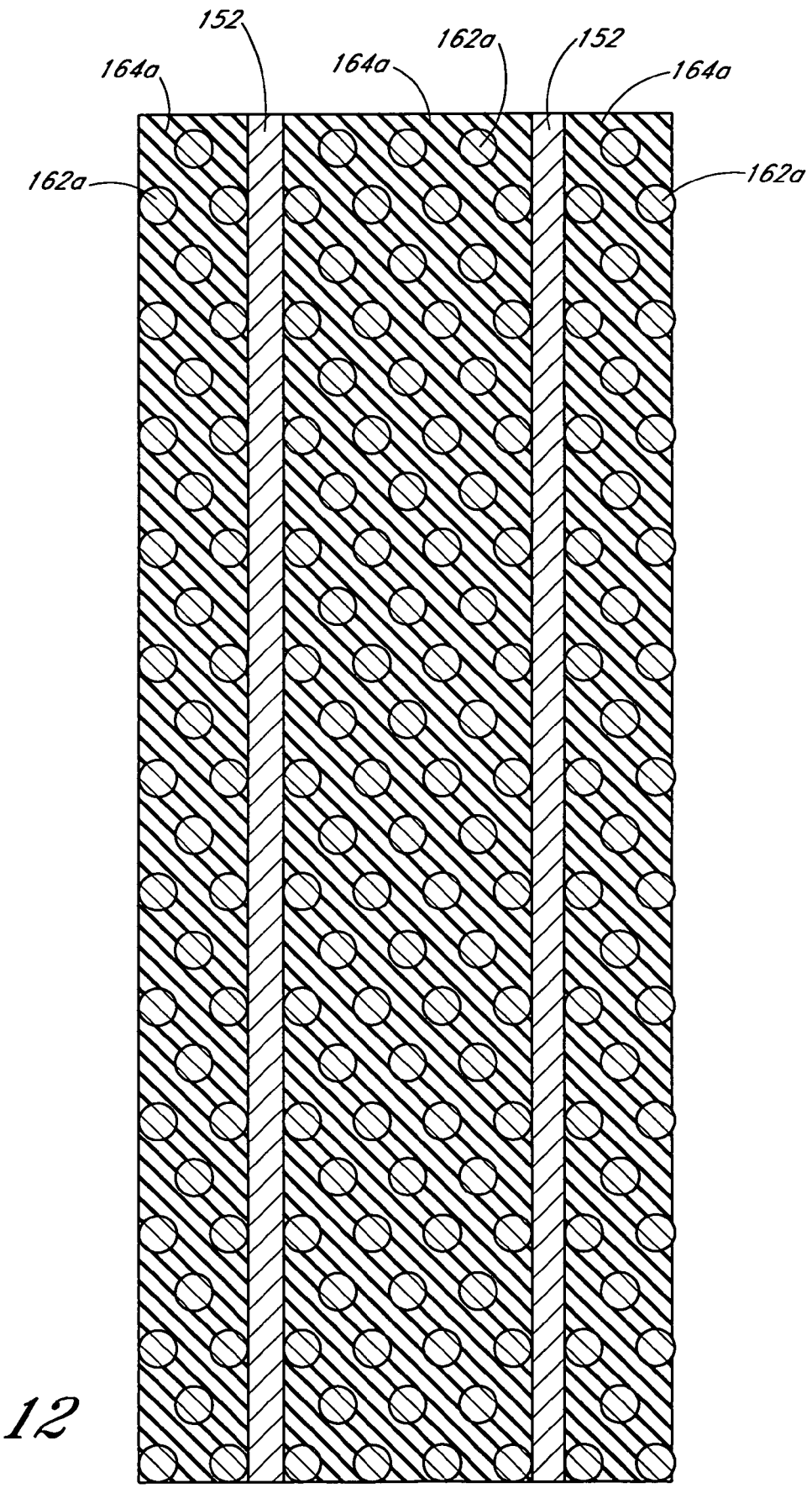

The thickness of the copolymer film 160 can be chosen based upon the desired pattern to be formed by the copolymers. It will be appreciated that, up to a particular thickness related to the polymer length scale and the environment in which the polymers are disposed, e.g., the distance between and the height of the spacers 152, the copolymers will typically orient to form alternating, substantially lamellar domains that form parallel lines, as viewed in a top-down view (FIG. 11). Such lamellae can be used to pattern, e.g., interconnects, or the lateral extension of the lamellae can be limited to form isolated features, e.g., transistor gates. Above a particular thickness related to the polymer length scale and the environment in which the polymers are disposed, the copolymers will typically orient to form vertically-extending pillars, such as cylinders, or spheres (FIG. 12). The cylinders can advantageously be used to pattern isolated features, e.g., vias or transistor gates. Thus, the pattern to be formed can advantageously be selected by appropriate selection of copolymer film thickness. Alternatively, other variables, such as copolymer composition or process conditions can be modified to facilitate the formation of vertically extending pillars or horizontally extending lamellae for a given thickness through appropriate selection of interfacial interactions between the blocks of the copolymer as well as the substrate surfaces. The thickness of the film 160 can be greater than, equal to or less than the height of the spacers 152. As noted below, a thickness which is greater than the height of the spacers can have advantages for providing a copolymer reservoir. In other embodiments, a thickness which is equal to or, more preferably, less than the height of the spacers can be advantageous by forming isolated islands of copolymers between the spacers 152, thereby preventing cross-diffusion of copolymers between the islands.

For forming lamellae, the copolymer film thickness is preferably less than about the length scale of the copolymer. For example, in the illustrated embodiment, the copolymer length scale is about 35 nm and the thickness of the films is preferably about 35 nm or less, more preferably, about 30 nm or less and, most preferably, about 25 nm or less. In one embodiment, the thickness is about 20 nm.

Figure 10:
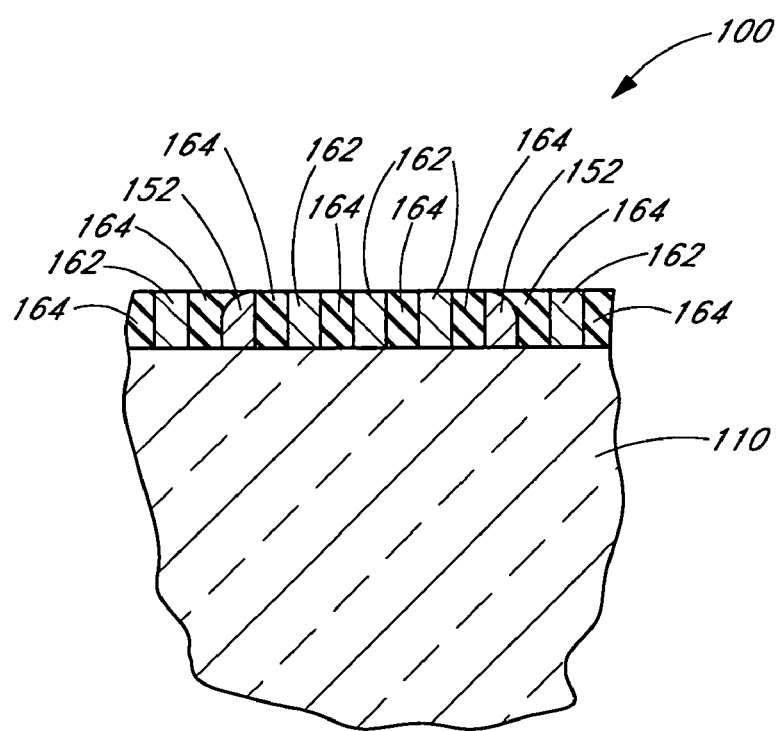
FIG. 10 is a schematic, cross-sectional side view of the partially formed integrated circuit of FIG. 9 after self-organization of the block copolymers, in accordance with preferred embodiments of the invention.

With reference to FIG. 10, the block copolymers in the copolymer film 160 are allowed to self-organize. The self-organization can be facilitated and accelerated by annealing the partially-fabricated integrated circuit 100. The temperature of the anneal is preferably chosen to be sufficiently low to prevent adversely affecting the block copolymers or the partially-fabricated integrated circuit 100. In the illustrated embodiment, the anneal is preferably performed at a temperature of less than about 250° C., more preferably, less than about 200° C. and, most preferably, about 180° C. Advantageously, the anneal can also cause cross-linking of the copolymers, thereby stabilizing the copolymers for later etching and pattern transfer steps.

The pattern of lamellae resulting after the anneal is shown in FIG. 10. Domains 162 of one block species, e.g., PS, and domains 164 of the other block species, e.g., PMMA, alternate between the spacers 152. It will be appreciated that the sizes of the block domains are determined by the sizes of the block species forming them.

With reference to FIG. 11, a top-down view of the partially fabricated integrated circuit of FIG. 10 is shown. The PS domains 162 can be seen alternating with the PMMA domains 164. Both domains 162 and 164 extend along the length of the spacers 152.

With reference to FIG. 12, in other embodiments, the thickness of the copolymer film 160 (FIG. 9) is chosen so as to form vertically extending cylinders (or other isolated pillar shapes, including pillars having rectangular or cubic horizontal cross-sectional areas) comprising PS and PMMA. The resulting arrangement, from a top-down view, has regions 162a of PS surrounded by regions 164a of PMMA. Such an arrangement can useful for forming, e.g., contact vias. In addition, the pillars can advantageously be applied in some arrangements for patterning arrays of features, particularly dense arrays of features, such as capacitors for memory applications, including DRAM. In such arrangements, the pillars can have a rectangular or cubic horizontal cross-sectional area, which can have advantages by providing a higher surface area structure.

Figure 13:
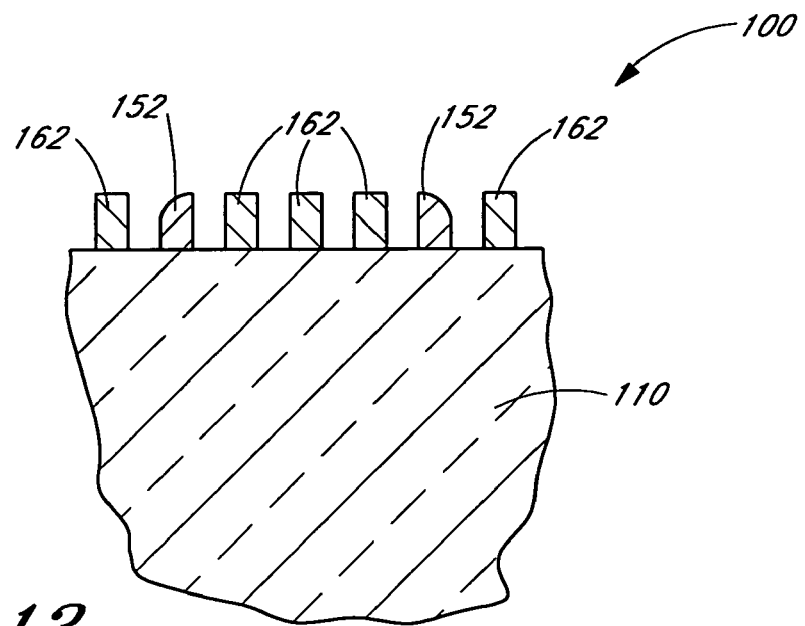
FIG. 13 is a schematic, cross-sectional side view of the partially formed integrated circuit of FIG. 12 after selectively removing one of two block copolymer blocks, in accordance with preferred embodiments of the invention.

With reference to FIG. 13, the PMMA domains 164 of FIGS. 10 and 11 are selectively removed, leaving behind the spacers 152 and the PS domains 162. The removal can be accomplished by performing a wet etch, e.g., using acetic acid as an etchant. In other embodiments, a dry or anisotropic etch may be appropriate where one of the domains can be etched at a faster rate than the other. It will be appreciated that the dimensions of the resulting features can vary, depending on the size of the copolymer used and process conditions. In some embodiments, the resulting pattern can advantageously comprise PS domains having a critical dimension of about 20 nm separated by spaces of about 20 nm. It will be appreciated that in other embodiments, the PS domains 162 and/or the spacers 152 can be removed instead, thereby leaving the PMMA domain 164, with or without the spacers 152.

Figure 14:
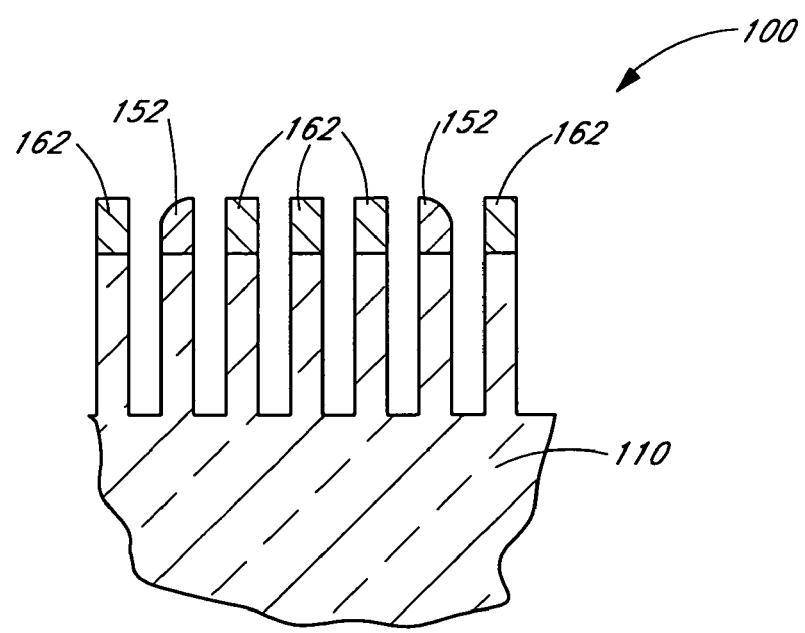
FIG. 14 is a schematic, cross-sectional side view of the partially formed integrated circuit of FIG. 13 after transferring the pattern defined by the block copolymers into the underlying substrate, in accordance with preferred embodiments of the invention.
Figure 15:
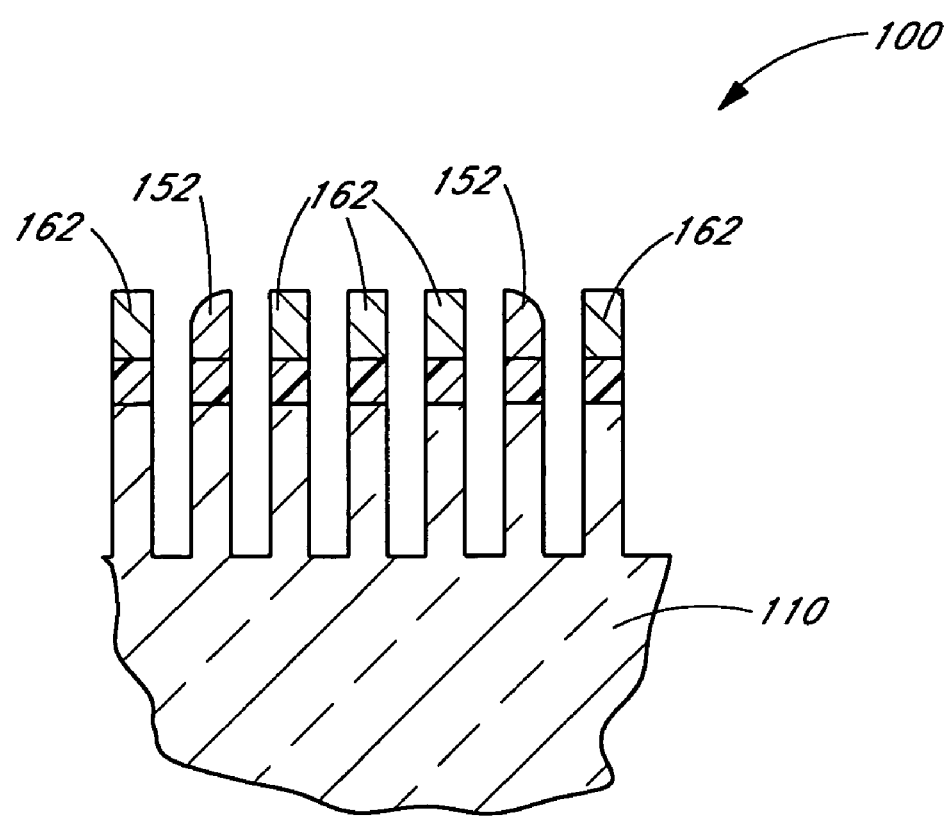
FIG. 15 is a schematic, cross-sectional side view of a partially formed integrated circuit after transferring a pattern defined by the block copolymers into a hard mask layer and then into an underlying substrate, in accordance with preferred embodiments of the invention.

With reference to FIG. 14, the spacers 152 and domains 162 can be used as a mask for processing of the underlying substrate 110. For example, the substrate 110 can be etched through the mask using, e.g., an anisotropic etch that selectively etches the substrate relative to both the spacers 152 and domains 162 to transfer the pattern in the mask to the substrate 110. In one example, where the spacers 152 are formed of silicon oxide and the substrate 110 is formed of silicon, the substrate 110 can be selectively etched relative to the spacers 152 and to the block domains 162 using a fluorine-based dry etch chemistry, e.g., such as that used to selectively remove silicon layers relative to photoresist. It will be appreciated that where the substrate 110 comprises layers of different materials, a succession of different chemistries, preferably dry-etch chemistries, can be used to successively etch through these different layers, if a single chemistry is not sufficient to etch all the different materials. It will also be appreciated that, depending upon the chemistry or chemistries used, the spacers 152 and the domains 162 may be etched. Consequently, with reference to FIG. 15, in some embodiments, the pattern formed by the spacers 152 and domains 162 can be transferred to an underlying hard mask layer 170, having good etch selectivity relative to substrate materials, before etching the substrate 110.

While the invention is not bound by theory, it will be appreciated that the different block species can self-aggregate due to thermodynamic considerations in a process similar to the phase separation of materials. The self-organization is guided by the spacers 152 (FIG. 9), which encourage the constituent blocks of the block copolymers to orient themselves along the length of the spacers 152. It will be appreciated that the self-organization can result in a more efficient packing of the copolymer species, such that copolymers available for the self-organization can be depleted if the copolymer film 160 extends over too large of an expanse, causing an area in the middle of the expanse to be formed without organized copolymers. In some embodiments, it will also be appreciated that the copolymer film 160 is preferably sufficient thick to extend above the spacers 152 to provide a reservoir of copolymers for the self-organization which occurs between the spacers 152. Moreover, the distance between the spacers 152 is preferably chosen to be sufficiently small to minimize the depletion effect that can occur over large expanses.

In other embodiments, the reservoir region above the spacers 152 can be enlarged beyond the spacers 152. Such an enlargement can have advantages for forming well-defined block domains between relatively widely separated spacers 152.

Figure 16:
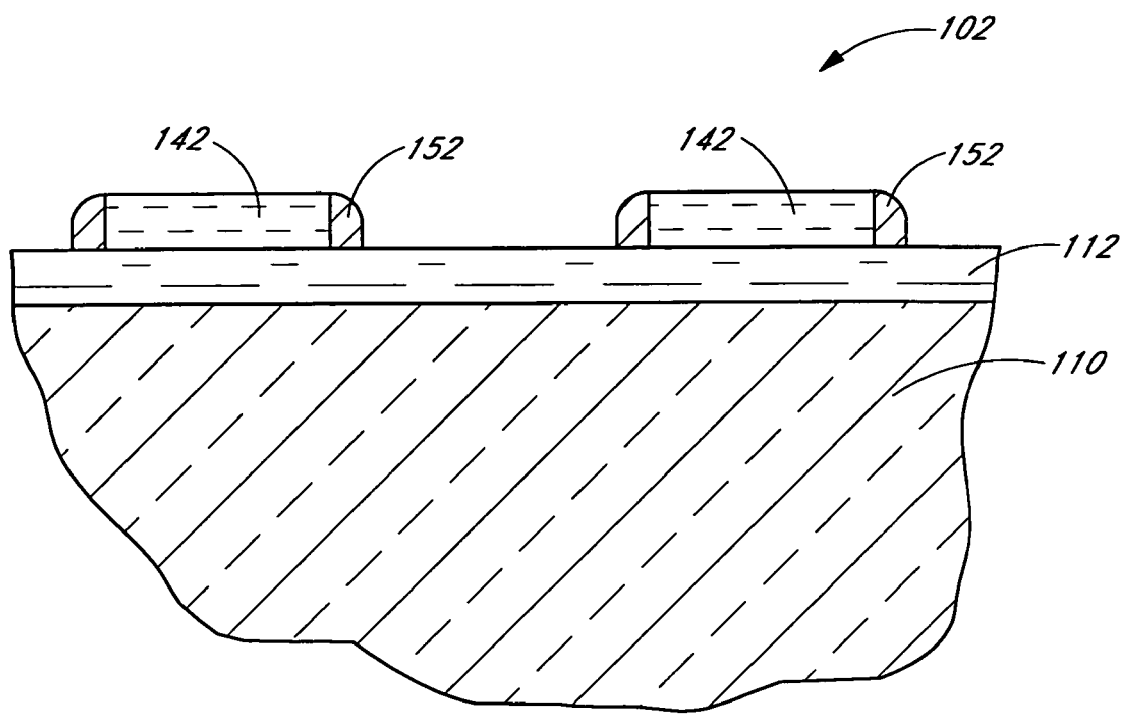
FIG. 16 is a schematic, cross-sectional side view of a partially formed integrated circuit after forming spacers on sidewalls of mandrels, in accordance with other preferred embodiments of the invention.

With reference to FIG. 16, the steps shown with reference FIGS. 1-6 can be used to form spacers 152 on the sides of mandrels 142, resulting in a partially fabricated integrated 102. The spacers 152 and mandrels 142 overly a hardmask layer 112, which overlies a substrate 110.

Figure 17:
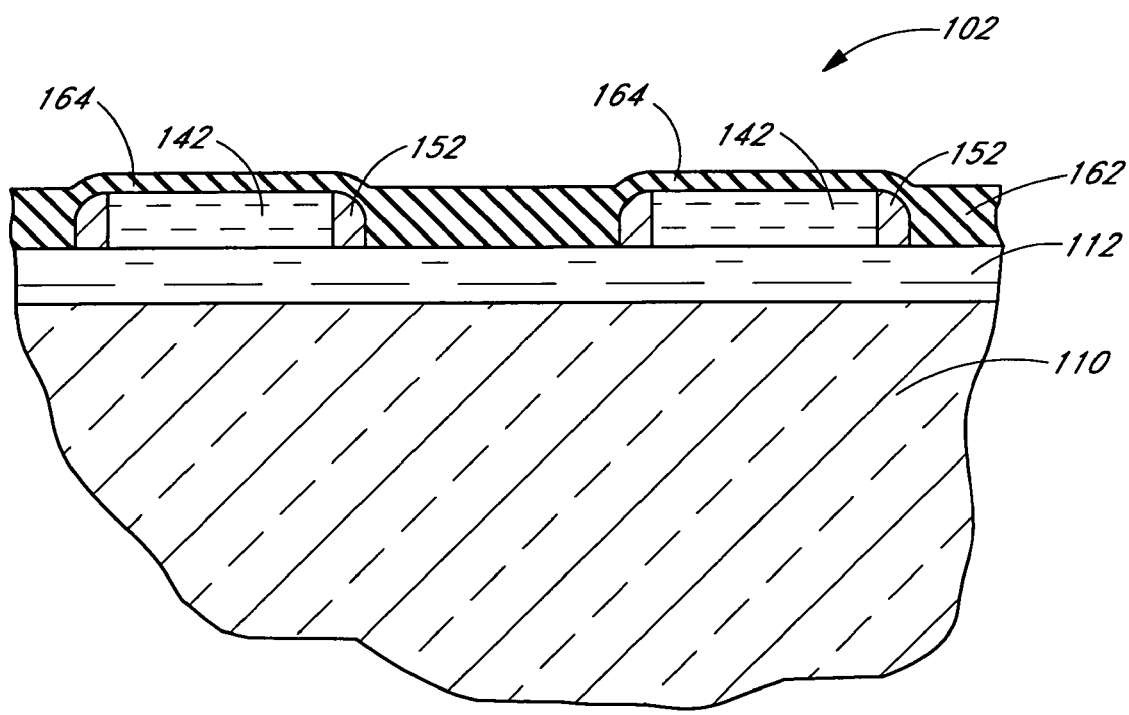
FIG. 17 is a schematic, cross-sectional side view of the partially formed integrated circuit of FIG. 16 after depositing a layer of a block copolymer solution, in accordance with preferred embodiments of the invention.

With reference to FIG. 17, a first layer 162 of block copolymer material is deposited between the spacers 152 and also over the spacers 152 and the mandrels 142. Advantageously, the mandrels 142 provide a relatively large surface area which allows the formation of a large reservoir 164 of block copolymer material. The block copolymer material can be similar to the block copolymer material discussed above, comprising, e.g., PS and PMMA, and can have a selected thickness as noted above.

Figure 18:
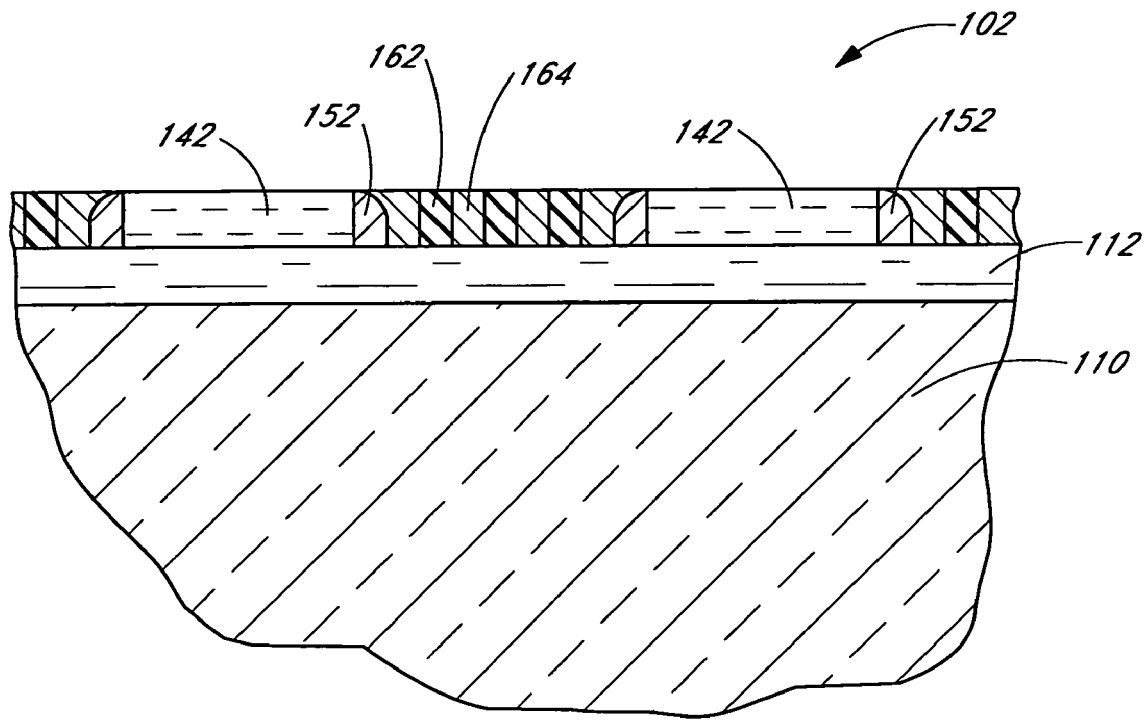
FIG. 18 is a schematic, cross-sectional side view of the partially formed integrated circuit of FIG. 17 after self-organization of the block copolymers, in accordance with preferred embodiments of the invention.

With reference to FIG. 18, the copolymers are allowed to self-organize, which can be accelerated by, e.g., annealing the partially fabricated integrated circuit 102. After the self-organization, a first set of alternating domains 162 of one block species, e.g., PS, and domains 164 of the other block species, e.g., PMMA, are formed in the open space between the spacers 152.

Figure 19:
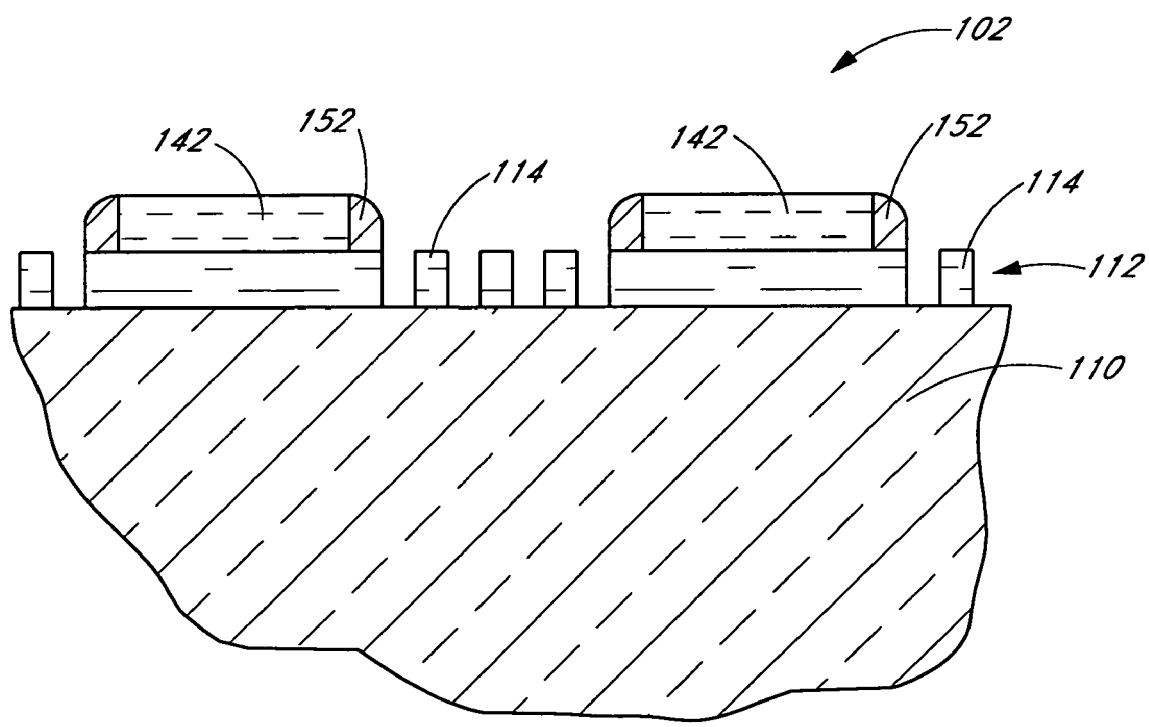
FIG. 19 is a schematic, cross-sectional side view of the partially formed integrated circuit of FIG. 18 after selectively removing one of two copolymer blocks, transferring the pattern formed by the remaining copolymer blocks into an underlying hardmask layer and removing the remaining copolymer blocks, in accordance with preferred embodiments of the invention.

With reference to FIG. 19, some of the block domains, e.g., the block domains 164, are selectively removed, the pattern defined by the remaining domains 162 is transferred to the underlying hardmask layer 112 (e.g., by an anisotropic etch selective for the hardmask layer 112) and the domains 162 are also removed, leaving behind a pattern of features 114 in the hardmask layer 112. It will be appreciated that, in a top down view, the features 114 can be lines or cylinders, as shown in FIGS. 11 and 12.

Figure 20:
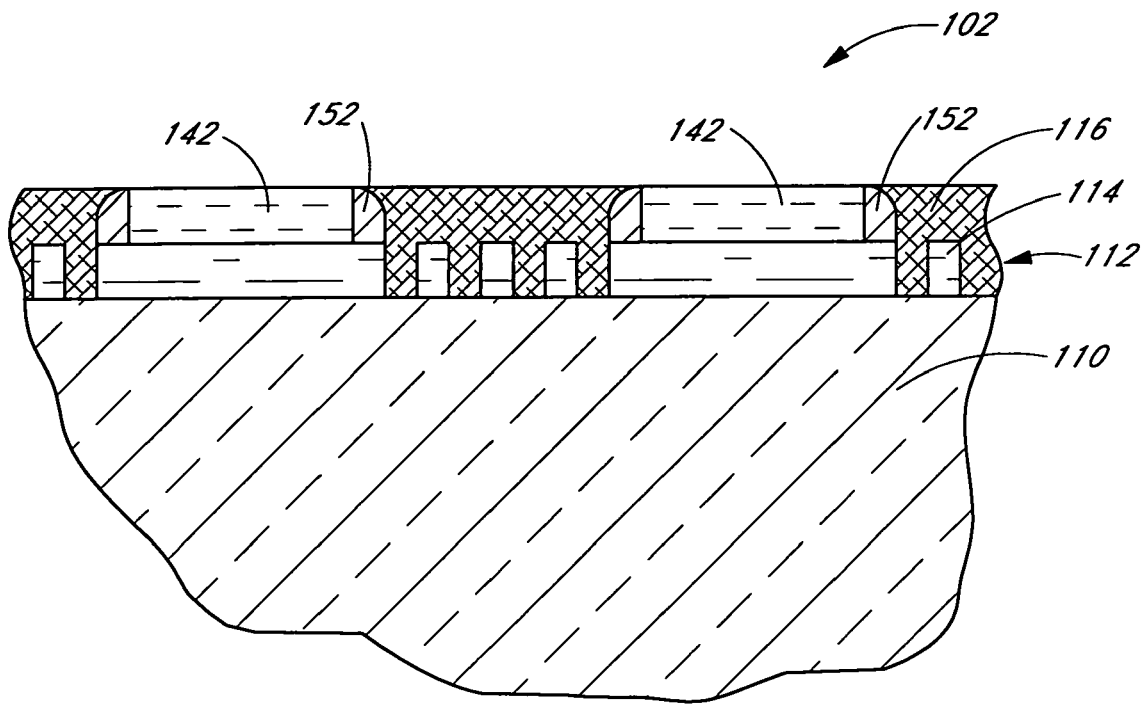
FIG. 20 is a schematic, cross-sectional side view of the partially formed integrated circuit of FIG. 19 after depositing a layer of filler material to fill in spaces between the spacers and planarizing to expose the mandrels, in accordance with preferred embodiments of the invention.

With reference to FIG. 20, a fill layer 116 is deposited around and over the features 114 to fill in the spaces between the spacers 152. The fill layer 116 is preferably formed of a planarizing material that can be spun on and that can fill the gaps between the features 114. Examples of planarizing materials for the fill layer 116 include photoresist or a spin on dielectric (SOD). The fill layer 116 can be planarized, e.g., by chemical mechanical polishing, or etched back to ensure that the mandrels 142 are exposed, as illustrated.

Figure 21:
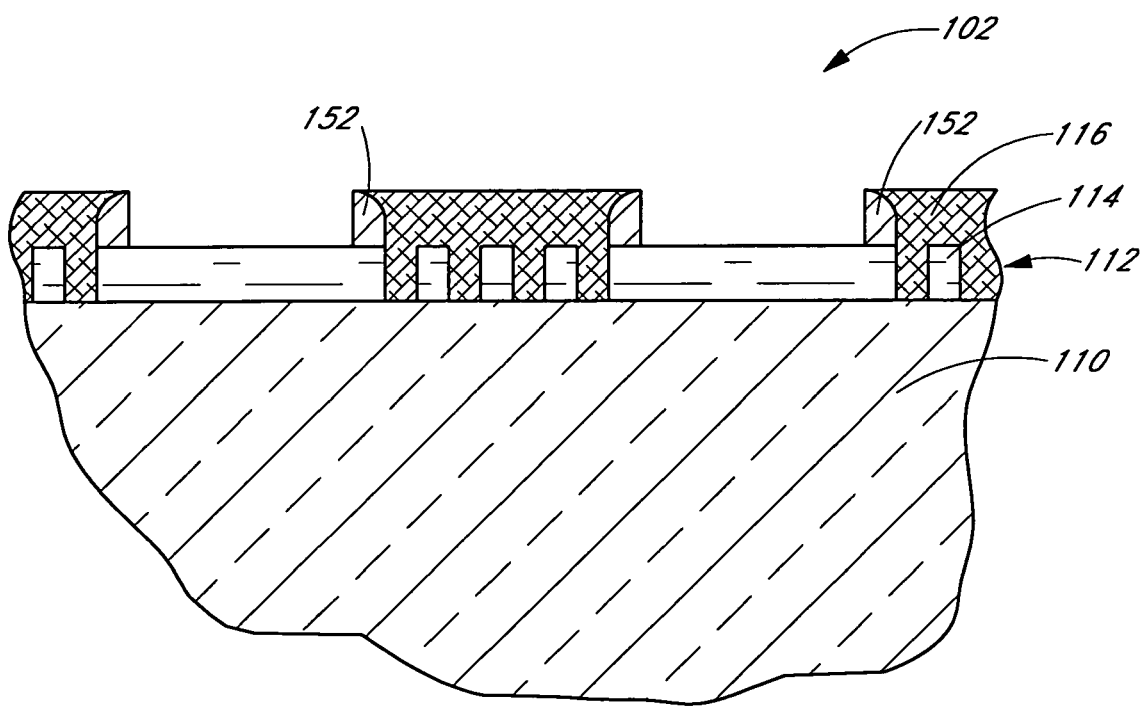
FIG. 21 is a schematic, cross-sectional side view of the partially formed integrated circuit of FIG. 20 after removing the mandrels, in accordance with preferred embodiments of the invention.
Figure 22:
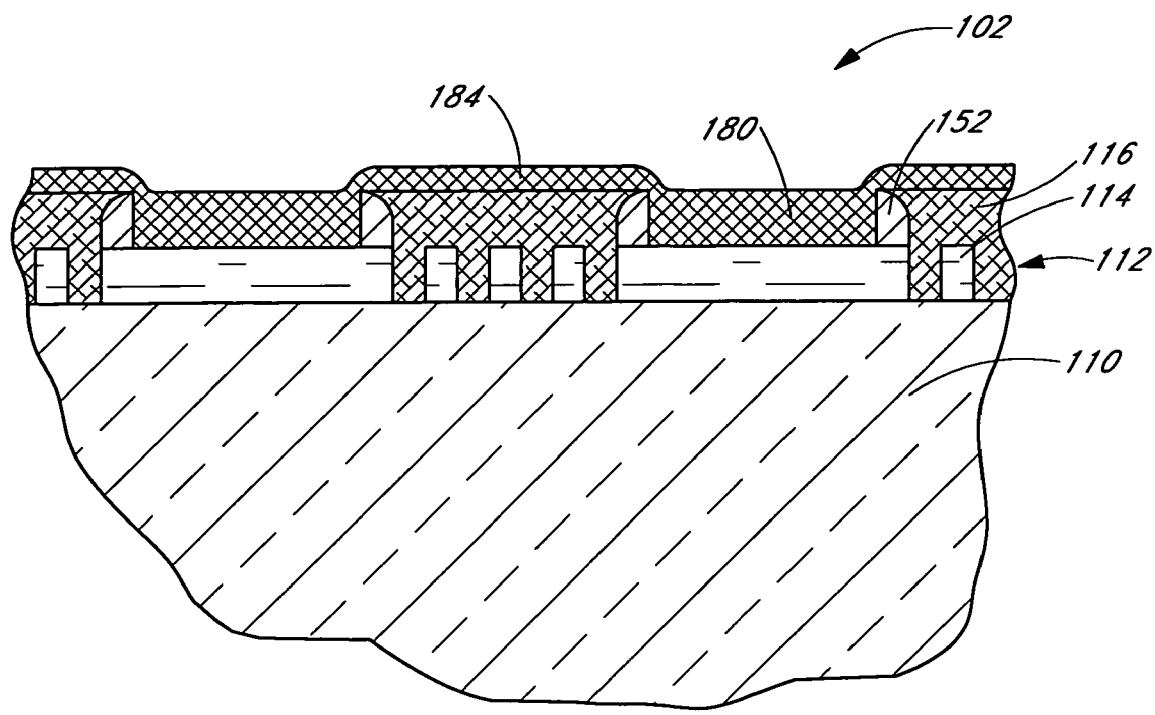
FIG. 22 is a schematic, cross-sectional side view of the partially formed integrated circuit of FIG. 21 after depositing a second layer of a block copolymer solution, in accordance with preferred embodiments of the invention.

With reference to FIG. 21, the mandrels 142 are selectively removed. With reference to FIG. 22, a second layer 180 of copolymer material is deposited. The copolymer material preferably occupies the open space between the spacers 152 and also overlies the remaining parts of the layer 116, forming a reservoir 184 of copolymer material over those areas. It will be appreciated that the copolymer material can be the same as that deposited to form the layer 162 (FIG. 17), although the material for the layers 180 and 162 can be different in some embodiments.

Figure 23:
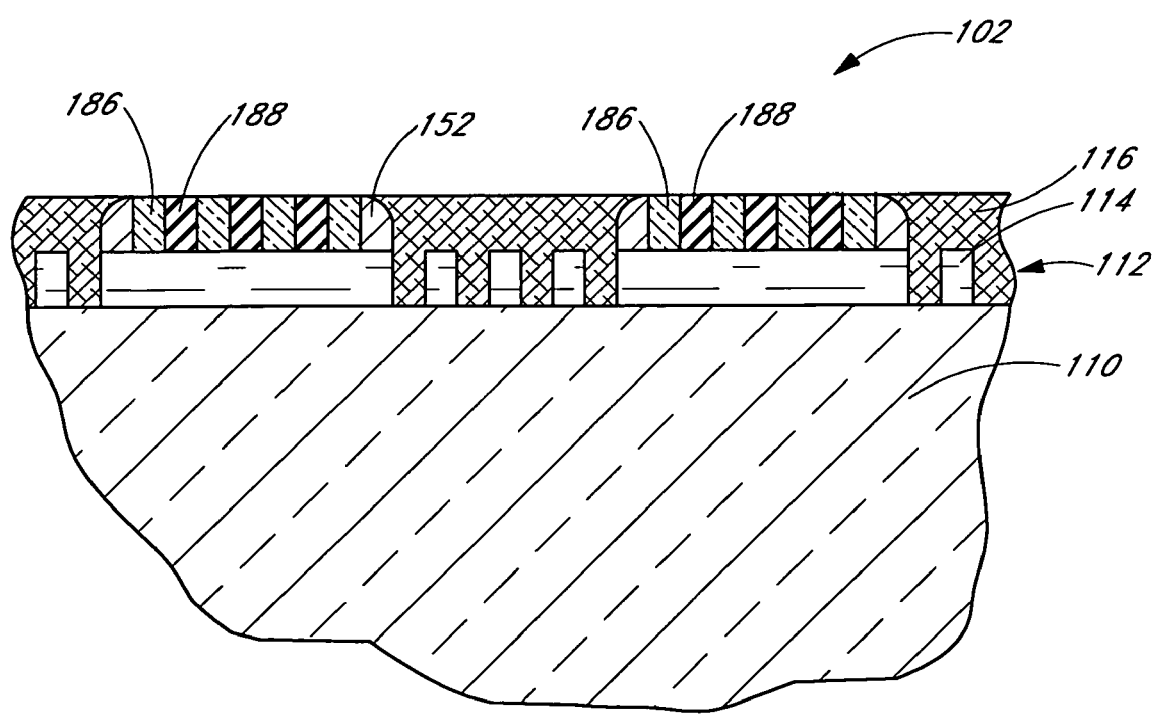
FIG. 23 is a schematic, cross-sectional side view of the partially formed integrated circuit of FIG. 22 after self-organization of block copolymers, in accordance with preferred embodiments of the invention.
Figure 24:
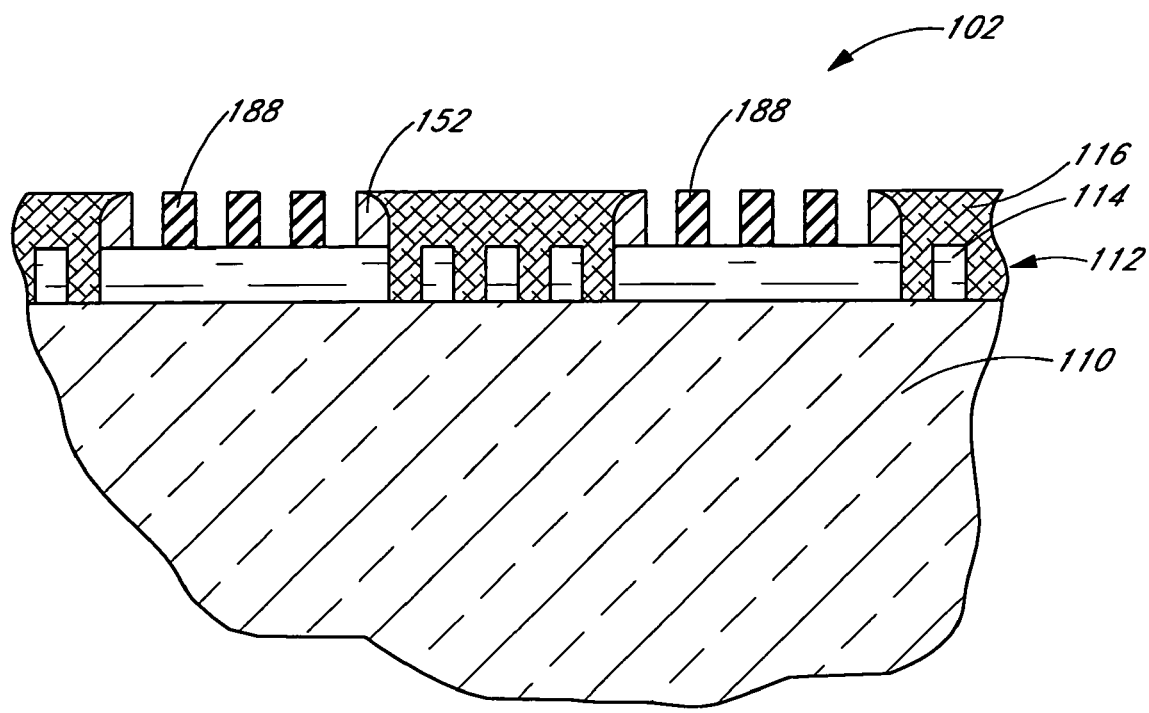
FIG. 24 is a schematic, cross-sectional side view of the partially formed integrated circuit of FIG. 23 after selectively removing one of two copolymer block species relative to the other block species and relative to the filler material, in accordance with preferred embodiments of the invention.

With reference to FIG. 23, copolymers in the copolymer layer 180 self-organize, e.g., during an anneal, to form a second set of alternating block domains 186 and 188. With reference to FIG. 24, one of the domains, e.g., the domains 186, are selectively removed, leaving behind the domains 188.

Figure 25:
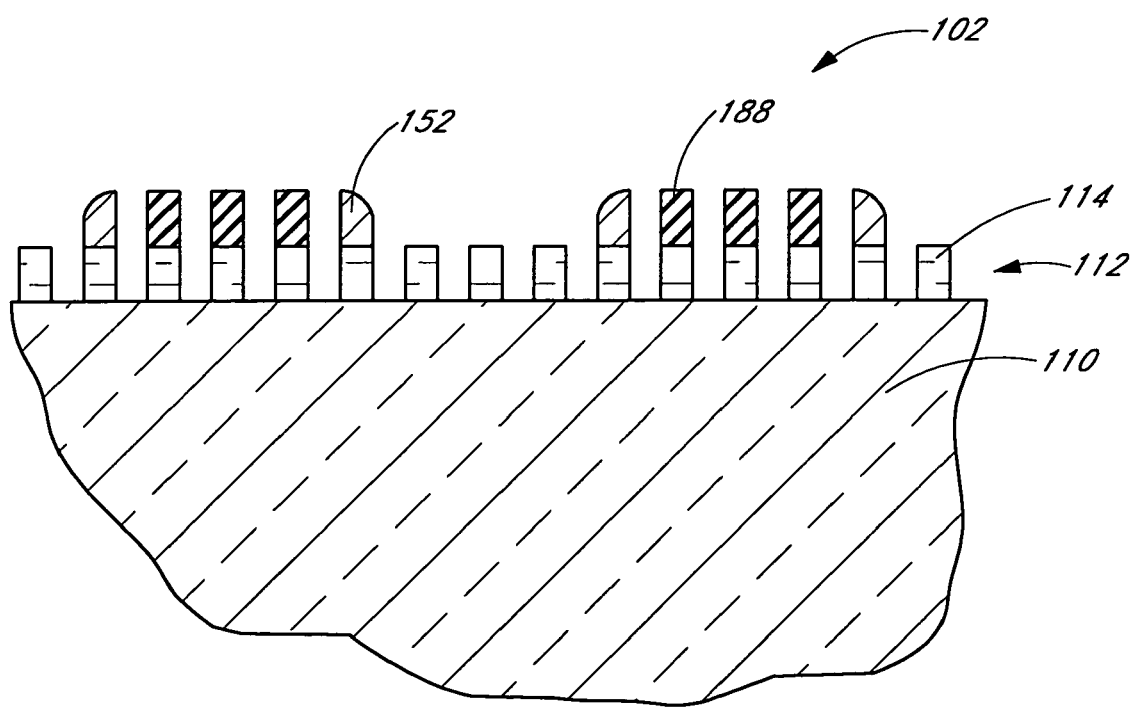
FIG. 25 is a schematic, cross-sectional side view of the partially formed integrated circuit of FIG. 24 after transferring the patterned formed by the remaining blocks into the underlying hardmask layer and removing the filler material, in accordance with preferred embodiments of the invention.

With reference to FIG. 25, the pattern defined by the domains 188 is transferred to the underlying hardmask layer 112 (e.g., by an anisotropic etch selective for the hardmask layer 112) and the remainder of the fill layer 116 is removed. Depending upon process parameters and the interactions of the blocks of the block copolymer material with each other and with exposed surfaces, the features 114 and 188 can appear, in a top down view, as lines or isolated cylinders (FIGS. 11 and 12, respectively).

Advantageously, in other embodiments, because the features 114 and 188 have been formed separately, those features can be made to organize into different patterns by establishing the appropriate conditions of the desired type of pattern. For example, the features 114 can form a pattern of cylinders, while the features 188 can form a pattern of lines. This can be accomplished, e.g., by using different copolymer compositions to form each of the features 114 or 188, or by increasing the tendency of the blocks to form lines by decreasing the height of the spacers 152, e.g., during a CMP or etch back process to expose the mandrels 142 (FIG. 20). In addition, the size and/or spacing between features 114 or 188, whether lines and/or vertical pillars, can advantageously be varied by, e.g., appropriate selection of chemical species and process conditions.

Figure 26:
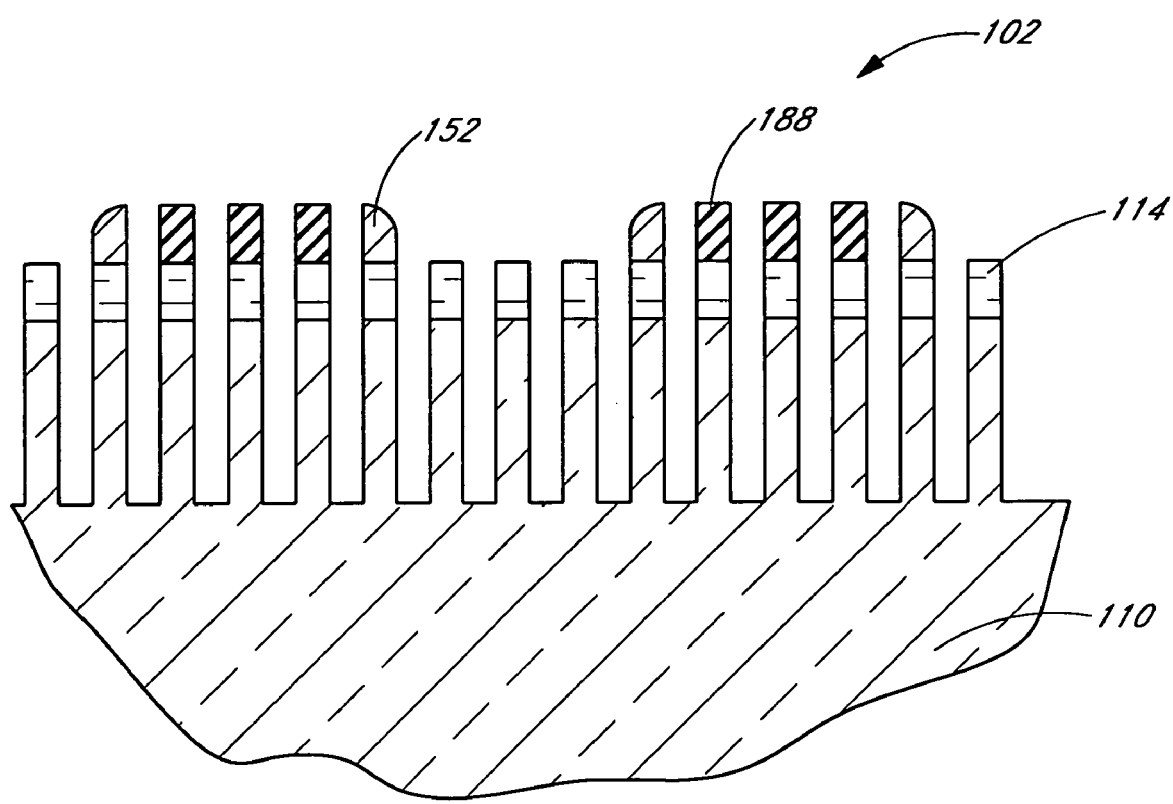
FIG. 26 is a schematic, cross-sectional side view of the partially formed integrated circuit of FIG. 25 after transferring a pattern defined by the copolymer blocks into an underlying substrate, in accordance with preferred embodiments of the invention.

With reference to FIG. 26, the spacers 152 and the domains 114 and 152 can be used as a mask for processing of the underlying substrate 110. As illustrated, the pattern defined by the domains 114 and 152 can be transferred to the substrate 110 using, e.g., an anisotropic etch selective for the material forming the substrate 110. As noted above, in some embodiments, the pattern can first be transferred to one or more intervening hardmask layers (not shown) before being transferred to the substrate 110.

It will be appreciated that various modifications of the preferred embodiments are possible. For example, while discussed in the context of diblock copolymers, the copolymers can be formed of two or more block species. Moreover, while the block species of the illustrated embodiment are each formed of a different monomer, the block species can share monomer(s). For example, the block species can be formed of different sets of monomers, some of which are the same, or can be formed of the same monomer, but in a different distribution in each block. Preferably, the different sets of monomers form blocks having different properties which can drive the self-organization of the copolymers.

In some embodiments, the hardmask and/or temporary layer overlying the substrate can be omitted. For example, the photodefinable material can be formed of or replaced by a material which has compatible with the temperatures and other conditions for spacer formation. In the illustrated embodiment, however, the hardmask and spacer layers are preferred for allowing high quality pattern transfers and for forming high quality spacers.

Also, while "processing" through a mask layer preferably involves etching an underlying layer, processing through the mask layers can involve subjecting layers underlying the mask layers to any semiconductor fabrication process. For example, processing can involve ion implantation, diffusion doping, depositing, or wet etching, etc. through the mask layers and onto underlying layers. In addition, the mask layers can be used as a stop or barrier for chemical mechanical polishing (CMP) or CMP can be performed on any of the layers to allow for both planarization and etching of the underlying layers, as discussed in U.S. Provisional Patent Application No. 60/666,031, filed Mar. 28, 2005, the entire disclosure of which is incorporated by reference herein.

In addition, while illustrated applied to an exemplary sequence for fabricating integrated circuits, it will be appreciated that the preferred embodiments can be applied in various other applications when the formation of patterns with very small features is desired. For example, the preferred embodiments can be applied to form gratings, disk drives, storage media or templates or masks for other lithography techniques, including X-ray or imprint lithography.

Accordingly, it will be appreciated by those skilled in the art that these and various other omissions, additions and modifications may be made to the methods and structures described above without departing from the scope of the invention. All such modifications and changes are intended to fall within the scope of the invention, as defined by the appended claims.

I claim:

1. A method for semiconductor fabrication, comprising:
   providing a plurality of pitch multiplied lines having a pitch of about 200 nm or less, wherein providing the plurality of pitch multiplied lines comprises:
      providing a plurality of mandrels;
      depositing a layer of spacer material on the mandrels;
      etching the spacer material to define spacers on sidewalls of the mandrels;
      removing the mandrels to leave a pattern of freestanding spacers, the spacers forming the pitch multiplied lines; and
   forming a pattern comprising block copolymers between the plurality of lines, wherein the block copolymers form a plurality of spaced-apart features between the plurality of lines.

2. The method of claim 1, wherein the pitch is about 100 nm or less.

3. The method of claim 1, further comprising selectively removing at least one block forming the block copolymers.

4. The method of claim 1, wherein forming the pattern comprises annealing a film comprising the block copolymers.

5. The method of claim 4, wherein the film has a thickness less than about a length scale of the block polymers.

6. The method of claim 1, wherein the block copolymers are formed of immiscible blocks.

7. The method of claim 1, wherein the lines comprise silicon.

8. The method of claim 7, wherein the lines comprise silicon oxide.

9. A method for mask formation, comprising:
   providing a pattern of spacers over a semiconductor substrate;

providing a homogeneous film of mask material extending between pairs of the spacers;

converting the homogeneous film into a patterned film comprising a pattern defined by mask material moieties, the patterned film extending continuously from a first spacer to a second spacer of each pair of spacers, wherein the mask material moieties define a plurality of mask features between each pair of spacers; and exposing the mask material to an etchant to form a pattern of voids in the exposed mask material.

10. The method of claim 9, wherein providing the pattern of spacers comprises performing pitch multiplication.

11. The method of claim 9, wherein providing the pattern of spacers comprises providing a plurality of free standing spacers.

12. The method of claim 9, wherein providing the pattern of spacers comprises providing spacers on sidewalls of mandrels.

13. The method of claim 12, further comprising removing the mandrels after exposing the mask material.

14. The method of claim 13, further comprising depositing a second layer of mask material after removing the mandrels.

15. The method of claim 14, further comprising self-segregating mask material moieties of the second layer of mask material to form a pattern defined by the mask material moieties of the second layer of mask material, wherein self-segregating occurs in a volume formerly occupied by the mandrels.

16. The method of claim 9, wherein converting the homogeneous film comprises promoting a self-segregation of chemical species forming the mask before exposing the mask material, wherein promoting the self-segregation organizes the mask material into domains, the domains each predominantly formed of a different moiety forming the chemical species.

17. The method of claim 16, wherein chemical species are block copolymers, wherein the moieties are blocks forming the copolymer and wherein exposing the mask material to etchant selectively removes a block species forming the block copolymers.

18. The method of claim 17, wherein the homogeneous mask material has a thickness sufficient to allow the formation of vertical lamellae within the mask material.

19. The method of claim 17, wherein the homogeneous mask material has a thickness sufficient to cause the formation of vertical cylinders within the mask material.

20. The method of claim 9, wherein exposing the mask material to the etchant comprises performing a dry etch.

21. The method of claim 9, wherein exposing the mask material to the etchant comprises performing a wet etch.

22. The method of claim 21, wherein the etchant comprises acetic acid.

23. The method of claim 9, wherein the remaining mask material comprises lines having a critical dimension of about 50 nm or less.

24. The method of claim 23, wherein the critical dimension is about 30 nm or less.

25. The method of claim 24, wherein the critical dimension is about 20 nm or less.

\* \* \* \* \*

UNITED STATES PATENT AND TRADEMARK OFFICE
CERTIFICATE OF CORRECTION

PATENT NO. : 7,579,278 B2  Page 1 of 1
APPLICATION NO. : 11/389581
DATED : August 25, 2009
INVENTOR(S) : Gurtej S. Sandhu It is certified that error appears in the above-identified patent and that said Letters Patent is hereby corrected as shown below:

On the face page, in field (73), in field "Assignee", in column 1, line 1, delete "Bosie, ID" and insert -- Boise, ID --, therefor.

In column 14, line 58, in Claim 5, delete "polymers." and insert -- copolymers. --, therefor.

Signed and Sealed this

Twenty-seventh Day of October, 2009

David J. Kappos
*Director of the United States Patent and Trademark Office*

UNITED STATES PATENT AND TRADEMARK OFFICE
CERTIFICATE OF CORRECTION

PATENT NO. : 7,579,278 B2                                   Page 1 of 1
APPLICATION NO. : 11/389581
DATED : August 25, 2009
INVENTOR(S) : Gurtej S. Sandhu It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 477 days.

Signed and Sealed this

Fourteenth Day of September, 2010

David J. Kappos
*Director of the United States Patent and Trademark Office*